US006812489B2

(12) United States Patent
Kawachi et al.

(10) Patent No.: US 6,812,489 B2
(45) Date of Patent: Nov. 2, 2004

(54) LIQUID CRYSTAL DISPLAY

(75) Inventors: Genshiro Kawachi, Hitachi (JP);
Yoshiro Mikami, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/365,525

(22) Filed: Feb. 13, 2003

(65) Prior Publication Data

US 2003/0160237 A1 Aug. 28, 2003

Related U.S. Application Data

(63) Continuation of application No. 09/562,908, filed on May 2, 2000, now abandoned, which is a continuation of application No. 08/885,182, filed on Jun. 30, 1997, now Pat. No. 6,104,040.

(30) Foreign Application Priority Data

Jul. 3, 1996 (JP) .............................................. 8-173188

(51) Int. Cl.$^7$ ................................................ H01L 29/04
(52) U.S. Cl. .............................. 257/59; 257/57; 257/72; 257/288; 257/347; 257/351; 257/368; 257/392
(58) Field of Search .............................. 257/57, 59, 72, 257/288, 347, 351, 368, 392, 3

(56) References Cited

U.S. PATENT DOCUMENTS

| | | |
|---|---|---|
| 5,017,983 A | 5/1991 | Wu |
| 5,196,911 A | 3/1993 | Wu |
| 5,493,129 A | 2/1996 | Matsuzaki et al. |

(List continued on next page.)

FOREIGN PATENT DOCUMENTS

| | | |
|---|---|---|
| EP | 0342925 | 11/1989 |
| EP | 0629003 | 12/1994 |
| JP | 405299436 A | 11/1993 |

OTHER PUBLICATIONS

1985 Int'l Display Research Conference "Active Matrix Addressed Liquid–Crystal Displays", S. Morozumi et al., 1985 IEEE, pp. 9–13.
"A Dynamic Threshold Voltage MOSFET (DTMOS) for Ultra–Low Voltage Operation)", F. Assaderaghi et al., 1994 IEEE, IEDM–94, pp. 809–812.
"Design Parameter Dependence and Optimization of Drain Characteristics of DTMOS", S. Komatsu et al., Technical Report of IEICE, VLD 96–43, ED96–89, SDM96–99 (Sep. 1996), pp. 17–22.
"High Current Gain Hybrid Lateral Bipolar Operation of DMOS Transistors", Olsson et al., IEEE Transactions on Electron Devices, vol. 42, No. 9, Sep. 1995, pp. 1628–1635.
"A 0.5 MTCMOS/SIMOX Circuit with 200 ps Logic Gate", T. Douseki et al., Technical Report of IEICE. SDM96–55. ICD96–75 (Jun. 1996), pp. 41–46.
"Low Voltage/Low Power SOI–DRAM with Multiple Body Control Circuits", Amano et al, Technical Report of IEICE., SDM96–54, ICE96–74 (Jul. 1996), pp. 33–39.

(List continued on next page.)

Primary Examiner—Long Pham
Assistant Examiner—Wai-Sing Louie
(74) Attorney, Agent, or Firm—Antonelli, Terry, Stout & Kraus, LLP

(57) ABSTRACT

A semiconductor element suitable for use in the display region of a liquid crystal display or for use in the drive circuit region for driving the display region is comprised of first, second, third and fourth electrodes; a pair of first conductivity type semiconductor layers separated from each other and connected to the second and the third electrodes, respectively; an intrinsic semiconductor layer connected to the pair of the first conductivity type semiconductor layers; and a second conductivity type semiconductor layer formed on the intrinsic semiconductor layer, wherein an insulating film is interposed between the first electrode and the intrinsic semiconductor layer, and the fourth electrode is formed on the second conductivity type semiconductor layer formed on the intrinsic semiconductor layer.

22 Claims, 19 Drawing Sheets

U.S. PATENT DOCUMENTS

| | | | |
|---|---|---|---|
| 5,605,847 | A | 2/1997 | Zhang |
| 5,627,084 | A | 5/1997 | Yamazaki et al. |
| 5,644,147 | A * | 7/1997 | Yamazaki et al. ............ 257/66 |
| 5,648,662 | A | 7/1997 | Zhang et al. |
| 5,744,821 | A | 4/1998 | Song |
| 5,751,381 | A | 5/1998 | Ono et al. |
| 5,789,762 | A | 8/1998 | Koyama et al. |
| 5,917,198 | A | 6/1999 | Maeda |
| 5,962,872 | A | 10/1999 | Zhang et al. |
| 5,977,560 | A | 11/1999 | Banerjee et al. |
| 6,104,040 | A * | 8/2000 | Kawachi et al. .............. 257/59 |
| 6,124,911 | A * | 9/2000 | Nakamura et al. .......... 349/113 |
| 6,229,156 | B1 | 5/2001 | Murai et al. |
| 6,335,542 | B2 | 1/2002 | Miyasaka |

OTHER PUBLICATIONS

"Design of 0.5V CMOS Logic Using SOI Technology", Fuse et al, Technical Report of IEICE, ED96–65, SDM96–48, ICD96–98 (Jun. 1996), pp. 73–80.

"Inverse Staggered Poly–Si and Amorphous Si Double Structure TFT's for LCD Panels with Peripheral Driver Circuits Integration", T. Aoyama et al, IEEE Transactions on Electron Devices, vol. 43, No. 5, May 1996.

"Gate–Overlapped Lightly Doped Drain Poly–Si Thin–Film Transistors for Large Area—AMLCD", K. Choi et al, IEEE Transactions on Electron Devices, vol. 45, No. 6, Jun. 1998.

* cited by examiner

● : ELECTRONS
○ : HOLES

LIQUID CRYSTAL DISPLAY

This application is a continuation of U.S. application Ser. No. 09/562,908, filed May 2, 2000, now abandoned, which, in turn, is a continuation of U.S. application Ser. No. 08/885,182, filed Jun. 30, 1997, now U.S. Pat. 6,104,040; and the entire disclosures of which are hereby incorporated by reference.

BACKGROUND OF THE INVENTION

The present invention relates to a semiconductor element and a liquid crystal display, and in particular, it relates to a semiconductor element, suitable for use as a thin film semiconductor element, and an active matrix addressing type liquid crystal display using the same.

As display devices for displaying image information and characters for use in the field of office automation equipment and the like, active matrix addressing liquid crystal displays using thin film transistors (hereinafter referred to as TFT) have been known. For this type of conventional liquid crystal display, further improvements in resolution and high quality of display, as well as cost reduction in manufacture, are necessary. In order to solve these problems, it is most important to improve the performance of the thin film transistor, which is a key device to the active matrix addressing liquid crystal display. In this regard, in the Conference Record of International Display Research Conference 1985, page 9, a concept of forming advanced high performance TFTs on a glass substrate was proposed, in which peripheral drive circuits for driving a TFT active matrix are fabricated using TFTs and are integrated with its display unit on the same substrate so as to reduce the cost of manufacture. With provision of advanced high performance peripheral drive circuits integrated on the glass substrate, since other circuits to be mounted externally and their mounting process can be simplified, a substantial reduction in the packaging cost can be expected. However, in order to provide these high performance circuits, development of a more improved, sophisticated high performance TFT is required. In particular, TFTs, which are formed on polycrystalline silicon (hereinafter referred to as poly-Si) and appear to be the most promising TFTs suitable for use in display equipment having integrated peripheral drive circuits, have further technical problems yet to be solved, which problems include the need for improvement of the carrier mobility and a lowering of the threshold voltage Vth.

A method of operation at a lower voltage by lowering the threshold voltage Vth of the transistors formed on an insulator has been proposed, as described in the Technical Digest of International Electron Device Meeting 1994, pages 809–812, in which a so-called dynamic threshold voltage MOSFET (hereinafter referred to as DTMOS) which has a fourth contact, separate from the source and drain, on a semiconductor film acting as a bipolar active layer, and is in contact with the gate electrode, is proposed as a submicron silicon-on-insulator (SOI) device.

In the technique described in the above-mentioned publication, the threshold voltage of the transistors is substantially reduced further to lower the operating voltage of the circuits thereof, thereby lowering the power supply voltage, and thus minimizing the power consumption in the drive circuits. This feature of decreased power consumption achieved by this drive circuit is desirable for use as a drive circuit and device for a liquid crystal display as well. It should be noted, however, that the above-mentioned publication is directed to the provision of logic devices or memory devices that can be operated at a low voltage and a high speed, and so they cannot be applied, as they are, to the drive devices for driving a liquid crystal display.

Namely, the semiconductor device, as described in the aforementioned publication at pages 809–812, is designed to operate effectively with a gate voltage at 0.6 V or less, and so this semiconductor device cannot be applied as it is to a liquid crystal display in which a lower limit of the gate drive voltage is determined by the liquid crystal drive voltage. More particularly, at least ±3 V in peak amplitude is required for driving normal liquid crystal materials, thereby a higher voltage than this minimum peak voltage is required as the gate voltage for driving pixel drive transistors in a liquid crystal device. Thus, the semiconductor device described above, which operates at the gate voltage less than 1 V, cannot be applied to a liquid crystal display.

SUMMARY OF THE INVENTION

An object of the invention is to provide an active matrix address type liquid crystal display in which the power consumption can be substantially reduced.

Another object of the invention is to provide a small power consumption liquid crystal display having a built-in drive circuit.

Still another object of the invention is to provide a drive circuit for use in a small power consumption liquid crystal display.

According to the invention, a semiconductor element for use as a switching element to be formed in a display area of the liquid crystal display or for use as a drive element to be formed in the area of a drive circuit for driving the display area is comprised of a first electrode, a second electrode, a third electrode and a fourth electrode; a pair of first conductivity type semiconductor layers separate from each other and connected to the second and the third electrodes, respectively; an intrinsic semiconductor layer connected to the pair of first conductivity type semiconductor layers; and a second conductivity type semiconductor layer formed on the intrinsic semiconductor layer; wherein an insulating film is interposed between the first electrode and the intrinsic semiconductor layer; and the fourth electrode is formed on the second conductivity type semiconductor layer which is formed on the intrinsic semiconductor layer.

Preferably, the pair of first conductivity type semiconductor layers and the second conductivity type semiconductor layer are separated from each other by the intrinsic semiconductor layer. Further, according to another aspect of the invention, the intrinsic semiconductor layer extends in lateral directions beyond the insulating layer at least towards the pair of the first conductivity type semiconductor layers on the substrate.

The first electrode and the fourth electrode are electrically connected via a resistance advantageously for wiring the liquid crystal display.

The intrinsic semiconductor layer, the first conductivity type semiconductor layers and the second conductivity type semiconductor layer are preferably formed of a thin film semiconductor made either of silicon, silicon germanium or silicon carbide. Further, they may be made of polycrystalline silicon films as well. In particular, it is preferable to use polycrystalline silicon films in a drive circuit built-in type liquid crystal display.

The semiconductor element of the invention can be designed to have a structure either of a planar type, an inverted staggered type or a positive staggered type. In the case of the inverted staggered type, a first electrode is formed on one of a pair of substrates, an insulating layer is formed on the first electrode, and an intrinsic semiconductor layer is formed on this insulating layer, then a pair of first conductivity type semiconductor layers are formed on the intrinsic semiconductor layer. Further, in the case of the planar type, the second, the third and the fourth electrodes are formed on one of the pair of substrates.

In the cases of both the positive staggered and the inverted staggered types, it is also possible for either one of the pair of the first conductivity type semiconductor layers or the second conductivity be formed by self-alignment utilizing a counterpart's pattern as its own masking pattern.

The semiconductor element of the invention can be used as complementary N–type and P–type semiconductor elements which can be formed in the drive circuit region in the liquid crystal display. More particularly, since a vertical scanning circuit and a picture signal drive circuit are provided in the drive circuit region, the complementary semiconductor element of the invention can be applied to a shift register within these circuits. More specifically, when the semiconductor element of the invention is used in the drive circuit region in a peripheral circuit built-in type liquid crystal display, the power consumption thereof can be reduced effectively and substantially.

According to the invention, an intrinsic semiconductor layer is formed as an i semiconductor layer between the first, the second and the third electrodes. Into this intrinsic semiconductor layer, a current carrier is injected which has a different polarity from the polarity of a current carrier in the impurity semiconductor layers of the first conductivity type which are connected to the second and the third electrodes respectively. According to this arrangement, when the impurity semiconductor layers connected to the second and the third electrodes, respectively, are formed of an n–type semiconductor layer, there is formed a p-i-n junction between a current carrier injection layer or the fourth electrode and the second electrode.

Further, when a voltage applied across the current carrier injection layer, i.e., the fourth electrode and the second electrode, is Vb, the voltage Vb is divided between an i-n junction and the i layer of the p-i-n junction, thereby preventing an excess current (base current) from flowing. Thereby, operation at a low power can be ensured until the gate voltage (to be applied to the first electrode) increases substantially. Namely, if a P–type or N–type semiconductor layer is used in place of the intrinsic semiconductor of the invention, a full voltage of Vb is applied to the source junction, and if Vb exceeds a built-in voltage (approximately 0.6 V) of the source junction, an excess current is caused to flow, thereby rapidly increasing the power consumption. In contrast, if an active semiconductor layer is comprised of an intrinsic semiconductor, excess base current will not flow until a substantially higher gate voltage is applied, thereby ensuring operation at a low power. In this case, due to adoption of the p-i-n junction, the degree of drop in the threshold voltage becomes mild, but it is still substantial compared to the conventional elements. Due to this drop in the threshold voltage, it becomes possible to operate the liquid crystal driving elements and associated peripheral circuits at lower voltages, thereby substantially reducing power consumption in active matrix type displays. BRIEF

DESCRIPTION OF THE DRAWINGS

These and other objects, features and advantages of the present invention will be understood more clearly from the following detailed description when taken with reference to the accompanying drawings, wherein.

DESCRIPTION OF THE PREFERRED EMBODIMENTS

Figure 1:
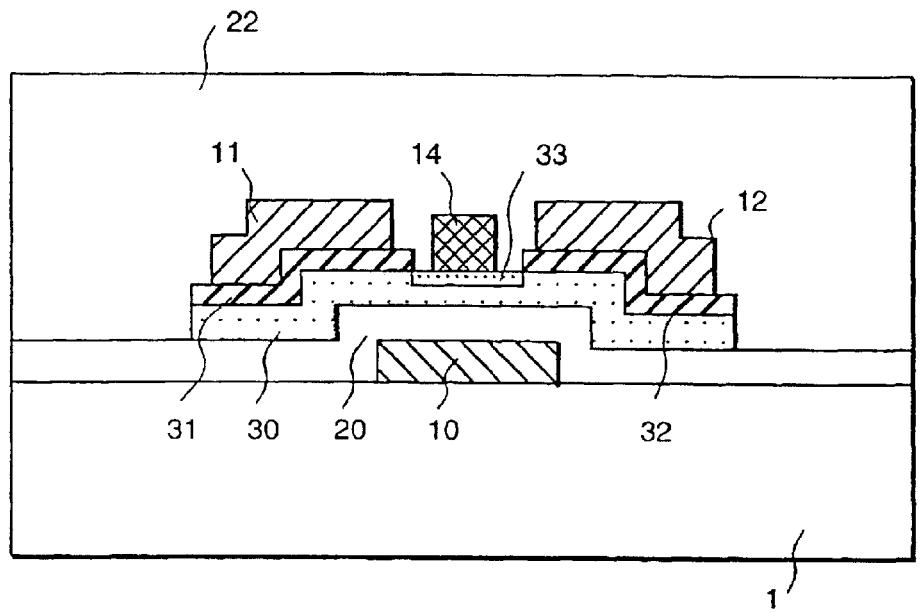
FIG. 1 is a cross-sectional view of a semiconductor element according to one embodiment of the invention.

Preferred embodiments of the invention will be described in detail with reference to the accompanying drawings.
First Embodiment:

With reference to FIG. 1, a first embodiment of the invention will be described in the following. FIG. 1 is a cross-sectional view of a semiconductor element according to the first embodiment, which has a gate electrode 10 as a first electrode made of chromium and formed on the surface of a glass substrate 1. Gate electrode 10 is overlaid by a gate insulating film 20 consisting of a SiN film. An intrinsic a-Si layer 30 is formed on gate insulating film 20. On the surface of the intrinsic a-Si layer 30, there are formed n–type a-Si layers 31, 32 which are doped with phosphor, and a p–type a-Si layer 33 which is doped with boron.

A p–type a-Si layer 33 is formed between a pair of n–type a-Si layers 31 and 32 on the intrinsic a-Si layer 30 by self-alignment using the pattern of n–type a-Si layers 31 and 32 as its own masking pattern. Use of the pattern of the n–type a-Si layers 31, 32 as its own mask pattern thereby to form the p–type a-Si layer 32 will enable forming both of the n–type a-Si layers 31, 32 and the p–type a-Si layer 33 by a single photolithographic process, thereby simplifying the fabrication process thereof and thus decreasing the production cost. Further, as the second and the third electrodes to be connected to the n–type a-Si layers 31 and 32, respectively, a source electrode 11 and a drain electrode 12 made of titanium are formed. Further, a base electrode 14 is formed in contact with the p–type a-Si layer 33 as a hole injection electrode. Then, the entire portion of the element is overlaid by a passivation film 22 made of SiN film, thereby providing for an n–type field effect transistor according to the invention.

Namely, according to this embodiment of the invention, the majority carrier is an electron, and the minority carrier is a hole. By applying a positive voltage, which is positive relative to the source electrode 11, to the base electrode 14, which is in contact with the p–type a-Si layer 33, the minority carrier of holes is caused to be injected into the intrinsic silicon layer 30.

Now, with reference to FIGS. 2 and 3, the operation of the semiconductor element of FIG. 1 will be described specifically. In the n–type transistor, with reference to FIG. 2, a conduction state (ON-state) is realized by applying positive voltages Vg and Vd, which are positive relative to source electrode 11, which is at ground potential, to the gate electrode 10 and the drain electrode 12, respectively. At this time, a positive voltage Vb is applied to the fourth electrode 14 (hereinafter referred to as the base electrode) which is in contact with the p+type layer 33 formed on the intrinsic semiconductor layer. By application of the positive voltage Vb, an n-i-p junction, comprised of the n+layer 31 in contact with the source electrode 11, the intrinsic semiconductor layer 30 and the p+layer 33, is biased in the forward direction, thereby causing holes to be injected through the p+layer 33 into the intrinsic semiconductor layer. A flow of injected holes is depicted by φh. Then, the injected holes drift toward the source electrode 11, but are blocked by a potential barrier at an n+/i junction formed between the n+layer 31 and the intrinsic semiconductor layer 30, thereby being accumulated in the vicinity of the n+/i junction. The accumulated holes in turn cause the potential barrier at the n+/i junction to be lowered. Thereby, a large amount of electrons are injected from the n+layer 31 into the intrinsic semiconductor layer 30 toward a channel ch formed at a boundary between the intrinsic-semiconductor layer 30 and the gate insulating film 20. A flow of injected electrons is depicted by φe. As a result, a substantial increase in the majority carrier current (electrons) can be realized by the injection of a small amount of minority carrier current (holes) according to the invention.

Figure 2:
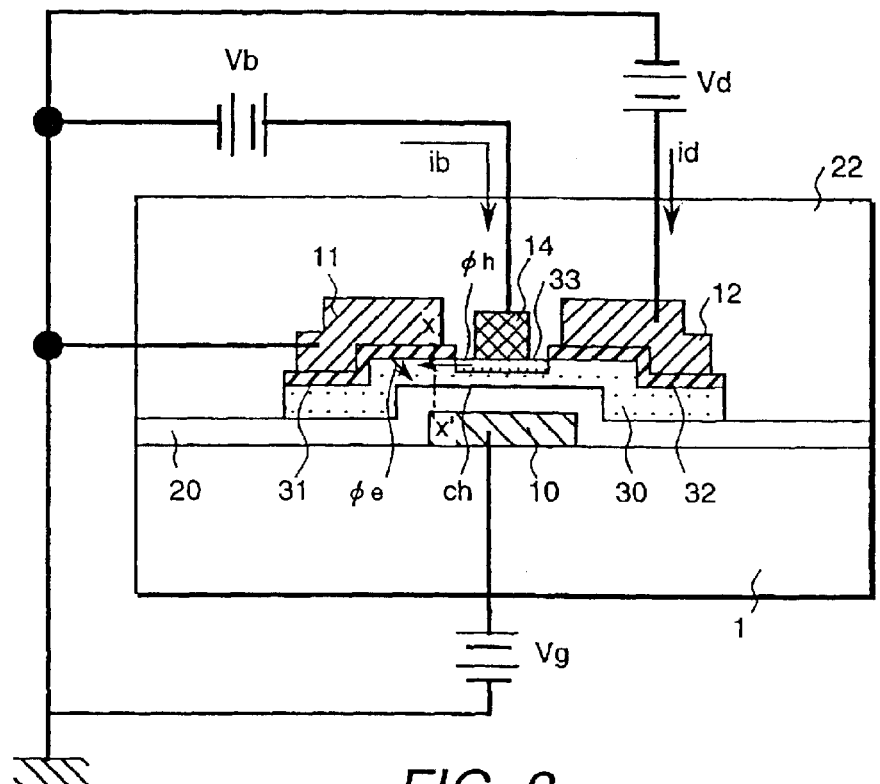
FIG. 2 is a schematic diagram in cross-section of the semiconductor element of FIG. 1 indicative of the principles of operation thereof.
Figure 3:
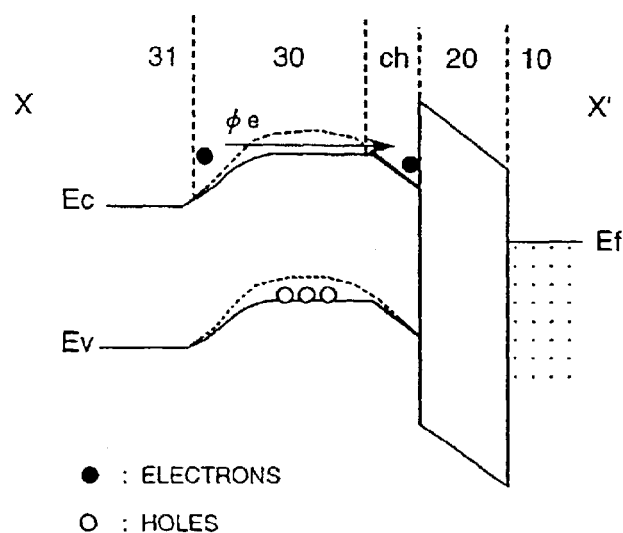
FIG. 3 is a schematic diagram of energy bands indicative of the principles of operation of the semiconductor element of FIG. 1.

The status of carrier flows across energy bands at the source junction along line X-X' of FIG. 2 is depicted in FIG. 3, where it is indicated that holes injected from the base electrode 14 are blocked by the potential barrier at the n+/i junction so as to be accumulated in the vicinity of the n+/i junction. Thereby, the potential energy in the intrinsic semiconductor layer 30 changes from its initial status prior to the accumulation of the injected holes, which is depicted by dotted lines, to a status as depicted by solid lines, thereby lowering the potential barrier against a mass of electrons present in the n+layer 31, thereby allowing the mass of electrons to be injected toward the channel ch as depicted by φe.

On the other hand, in order to cut-off the transistor, a negative voltage is applied to gate 10 as well as to base electrode 14 such that the n-i-p junction is biased in the reverse direction. When the n-i-p junction is reversely biased, the injection of holes from the base electrode 14 is stopped, thereby interrupting the current.

Figure 4:
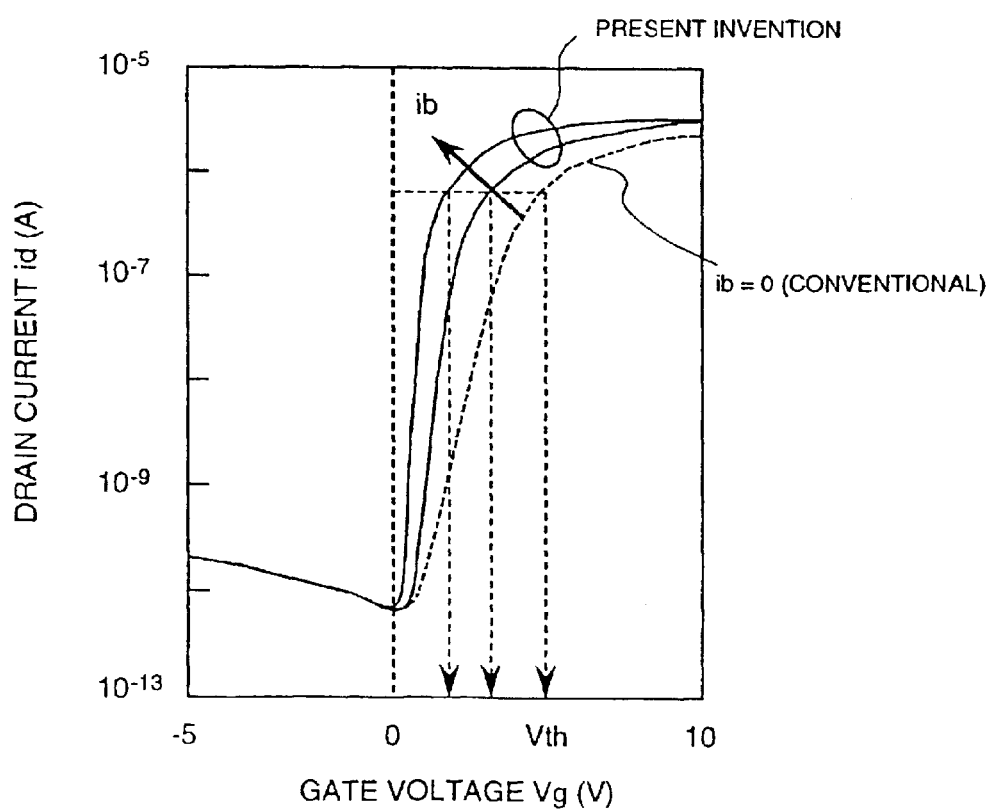
FIG. 4 is a diagram indicative of transfer characteristics of the semiconductor element of FIG. 1.

According to the feature of this embodiment of the invention, the effect of current amplification in the transistor is most significant in a subthreshold region in which electron current is restricted due to injection from the source electrode 11, and thus the transfer characteristics therein change such that a current rise becomes steep in the subthreshold region R with an increasing base current ib as indicated in FIG. 4, thereby advantageously allowing the threshold voltage Vth to decrease.

Figure 5:
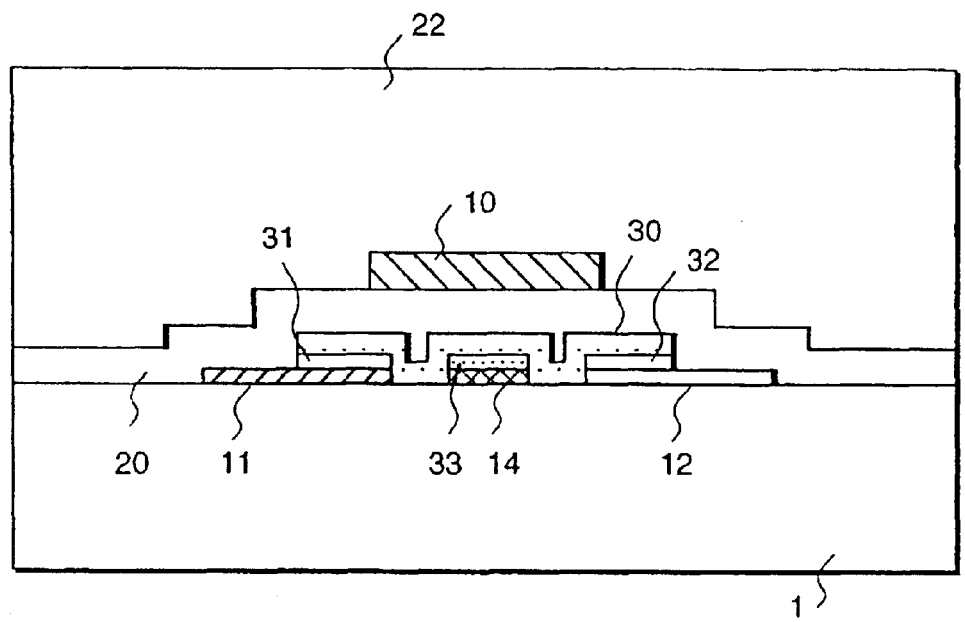
FIG. 5 is a cross-section of a semiconductor element according to a second embodiment of the invention.

According to this feature of this embodiment of the invention as described above, since the intrinsic semiconductor layer 30 is used as its semiconductor layer, when a voltage Vb is applied between the base and the source, the voltage Vb is subdivided between the i-layer and the i/n junction of the p-i-n junction, thereby preventing an excess base current from flowing until a substantially higher voltage is applied across the base and the source, thereby ensuring operation at a higher gate voltage, for example, exceeding ±5V and at a reduced power consumption. Thereby, when a semiconductor device having a threshold voltage which can be lowered is utilized as a liquid crystal driving element or as a peripheral circuit device thereof, it becomes possible to lower the voltage to drive the liquid crystal display, thereby minimizing the power consumption in the active matrix addressing type display.
Second Embodiment FIG. 5 is a cross-sectional view of a semiconductor device according to a second embodiment of the invention.

The semiconductor device according to the second embodiment of the invention has a structure of a positive stagger type TFT, in which a source electrode 11, a drain electrode 12 and a base electrode 14 each made of chromium are formed on the surface of a glass substrate separate from each other. On the surfaces of the source electrode 11 and the drain electrode 12 there are formed n-type a-Si layers 31 and 32, respectively, and on the surface of the base electrode 14 there is formed a p-type a-Si layer 33. An intrinsic semiconductor layer (intrinsic a-Si layer) 30 is formed between the source and base electrodes, between the base and drain electrodes, and on the surfaces of the n-type a-Si layers 31 and 32, as well as on the p-type a-Si layer 33. A gate insulating film 20 made of a silicon nitride (SiN) film is formed on the surface of the intrinsic semiconductor layer 30, and further a gate electrode 10 made of aluminum is formed on the gate insulating film 20. Then, the whole structure of the device described above is encapsulated in a passivation film 22 made of a silicon nitride (SiN) film.

In the semiconductor device according to the second embodiment of the invention, the majority carriers are electrons and the minority carriers are holes the first embodiment of the invention.

According to this arrangement of the second embodiment of the invention, a positive voltage, which is positive relative to a voltage at the source electrode 11, is applied to the base electrode 14, which is in contact with p-type a-Si layer 33, thereby causing the minority carrier of holes to be injected into the intrinsic semiconductor layer 30. Thereby, under the same principle as described with reference to the first embodiment of the invention, it becomes possible to lower its threshold voltage and in consequence to improve its current drivability substantially.

In this second embodiment of the invention, the intrinsic semiconductor layer (intrinsic a-Si layer) 30 is utilized as its active layer in the same manner as in the first embodiment of the invention, however, the invention is not limited thereto, since other semiconducting materials, such as, for example, polycrystalline silicon (poly-Si) or silicon germanium (SiGe) films, can be utilized as well to the same effect.

Third Embodiment

Figure 6:
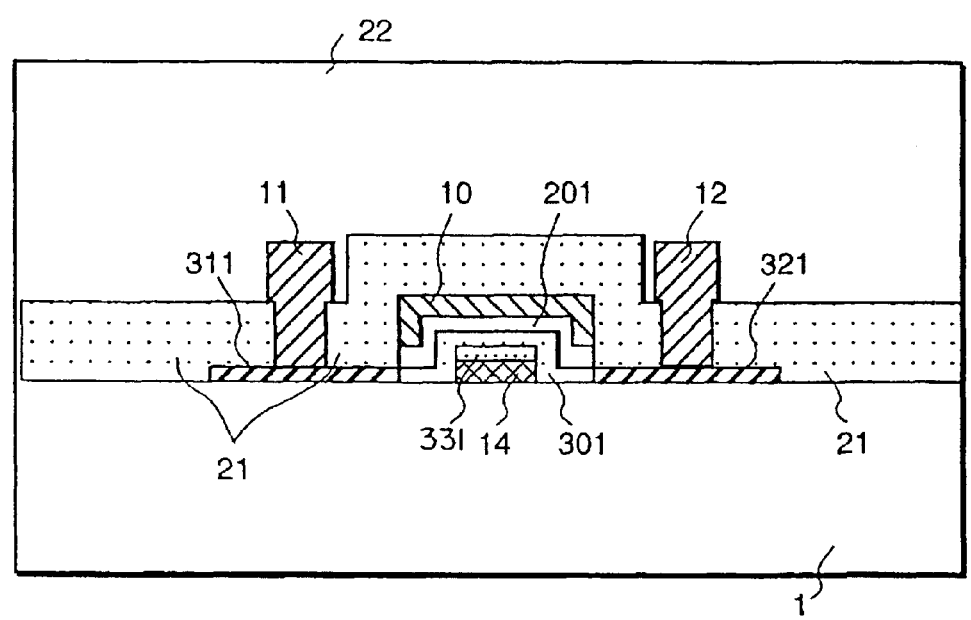
FIG. 6 is a cross-section of a semiconductor element according to a third embodiment of the invention.

FIG. 6 is a cross-sectional view of a semiconductor device according to a third embodiment of the invention.

The semiconductor device according to the third embodiment of the invention has a structure of a planar-type TFT, in which a base electrode 14 made of chromium is formed on a glass substrate 1 in the center portion thereof, and n-type poly-Si layers 311 and 321 are formed on the glass substrate separated by base electrode 14 interposed therebetween. A p-type poly-Si layer 331 is formed on the surface of the base electrode 14. Further, an intrinsic semiconductor layer (intrinsic poly-Si layer) 301 is formed surrounding both the base electrode 14 and the p-type poly-Si layer 331. A gate insulating film 201 made of SiO2 is formed on a part of the intrinsic semiconductor layer 301, then, a gate electrode 10 made of aluminum is formed on the gate insulating film 201. The n-type poly-Si layers 311 and 321 formed in contact in part with intrinsic semiconductor layer 301 are further connected with a source electrode 11 and a drain electrode 12 both made of chromium, respectively. Then, the source electrode 11, the drain electrode 12 and the gate electrode 10 are surrounded by a protective insulating film 21, and the entire structure of the device is encapsulated in a passivation film 22. Also, in this third embodiment of the invention, the majority carriers are electrons and the minority carriers are holes as in the first embodiment of the invention.

According to this third embodiment of the invention, when a positive voltage, which is positive relative to a voltage at the source electrode 11, is applied to the base electrode 14, which is in contact with p-type poly-Si layer 331, the minority carriers of holes are caused to be injected into the intrinsic semiconductor layer 301. Thereby, under the same principle as operation of the semiconductor device indicated in FIG. 1, it becomes possible to lower the threshold voltage, thereby substantially improving the current drivability.

Further, according to this embodiment of the invention, the n-type poly-Si layers 311 and 321 are formed by means of self-alignment with respect to the pattern of the gate insulating film 201 and the gate electrode 10. Namely, the pattern of the gate insulating film 201 and the gate electrode 10 is utilized as a mask to form the n-type poly-Si layers 311 and 321. Thereby, a single step of photolithographic processing allows provision of both patterns of the n-type poly-Si layers 311 and 321, as well as the gate electrode 10, thereby simplifying the process of fabrication and reducing the cost of manufacture. Still further, there is another advantage that parasitic capacitances between the gate electrode 10 and the source electrode 11, as well as between the gate electrode 10 and the drain electrode 12, can be minimized since the width of overlapping of the gate electrode 10 with the n-type poly-Si layers 311, 312 is minimized due to the self-alignment processing of the invention, thereby realizing a faster operation of the device.

Fourth Embodiment

When a semiconductor device is formed having four terminals of a gate electrode, a source electrode, a drain electrode and a base electrode this semiconductor device having four terminals cannot be applied as it is to a transistor for use in a liquid crystal display or in its associated drive circuit, which principally requires three-terminal transistors. Therefore, in order to utilize this four-terminal transistor, an additional wiring must be provided for supplying a base current, which substantially complicates its circuit configuration and increases the area required for the circuits.

Figure 7:
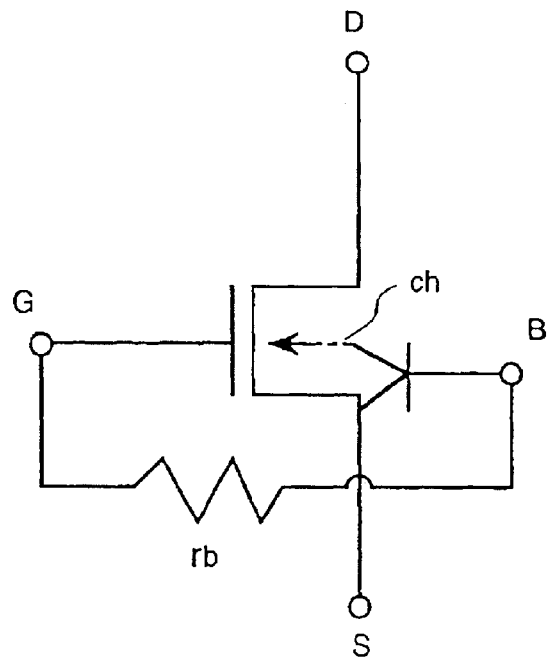
FIG. 7 is an equivalent circuit diagram of a semiconductor element according to a fourth embodiment of the invention.

Thereby, with reference to FIG. 7, by taking into consideration the fact that an npn type bipolar transistor comprising an n-type a-Si layer 32, a p-type a-Si layer 33 and an n-type a-Si layer 31 is formed between the source electrode 11 and the channel ch in this field effect transistor (FET) of the fourth embodiment of the invention, it is contemplated that a base current can be supplied from the gate by providing a connection between the base electrode 14 and the gate electrode 10 via a resistance rb having an appropriate value.

When the gate and base are connected via resistance rb, the additional wiring that conventionally would have been required for supplying a base current to the base electrode can be eliminated, thereby simplifying the wiring substantially and improving the density of circuit integration, thereby allowing a finer resolution of display to be realized.

Fifth Embodiment

Figure 8:
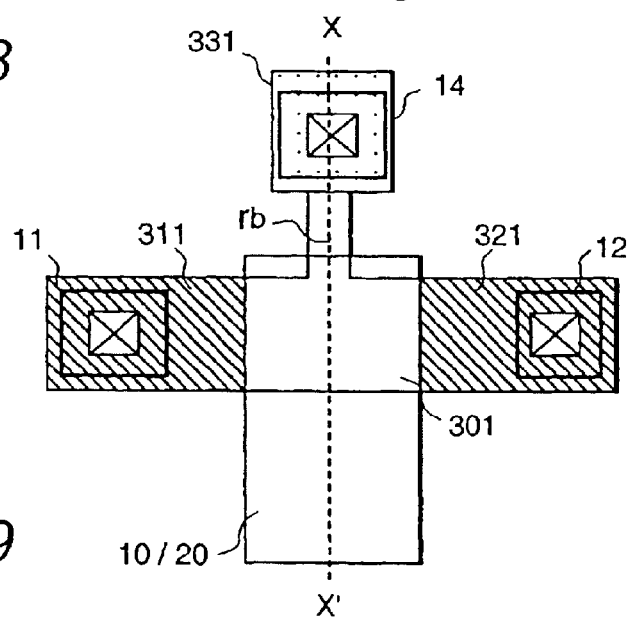
FIG. 8 is a plan view of a semiconductor element according to a fifth embodiment of the invention.
Figure 9:
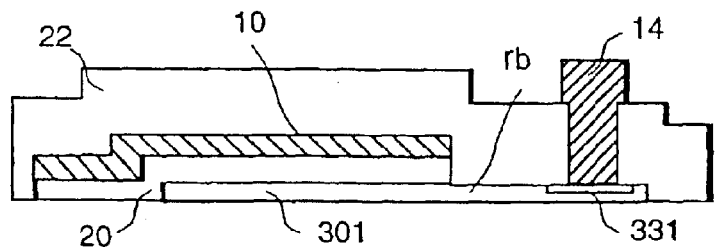
FIG. 9 is a cross-section of a TFT taken along line X-X' in FIG. 8.

FIG. 8 is a plan view of a planar type TFT forming a fifth embodiment of the invention, and FIG. 9 is a cross-sectional view of the planar type TFT taken along line X-X' in FIG. 8.

According to this embodiment of the invention, an intrinsic semiconductor layer 301 having a convex planar pattern and a pattern of a gate electrode 10 disposed in the center thereof are formed, and on the both sides thereof are formed n+layers 311 and 321 as the source and drain, respectively. By way of example, the n+layers 311 and 321 are formed on a glass substrate like the planar type transistor of FIG. 6. In the upper protruding portion of the intrinsic semiconductor layer 301 there is formed a p+layer 331, which serves as the base. The source electrode 11 and the drain electrode 12 are formed in contact with the n+layer 311 acting as a source and the n+layer 321 acting as a drain, respectively. A portion extending below the gate electrode from the intrinsic semiconductor layer 301 (channel) to the p+layer 331 is not doped with any impurities of P-type or N-type and forms a high resistance layer rb. The source and drain of the n+layers 311, 321, as well as the base of the p+layer 331, are separated by the intrinsic semiconductor layer 301 from each other.

Also, in this embodiment of the invention, like the first embodiment, the majority carrier is an electron and the minority carrier is a hole. By applying a positive voltage which is positive relative to the source electrode 11 to base electrode 14, which is in contact with the p-type poly-Si layer 331, the minority carrier of holes is caused to be injected into intrinsic poly-Si layer 301. Thereby, according to the same principle of operation as in the semiconductor element of FIG. 1, its threshold voltage can be decreased, thereby improving its current drive capability.

Further, by providing an electrical connection between base electrode 14 and gate electrode 10 according to this embodiment of the invention, the operation available with the three terminal structure as indicated in FIG. 7 becomes possible. In this instance, since the high resistance layer rb acts to limit the base current, injection of an excessive base current is prevented, thereby allowing operation at a low power until the gate voltage increases to exceed, for example, ±5 V.

Figure 25A:
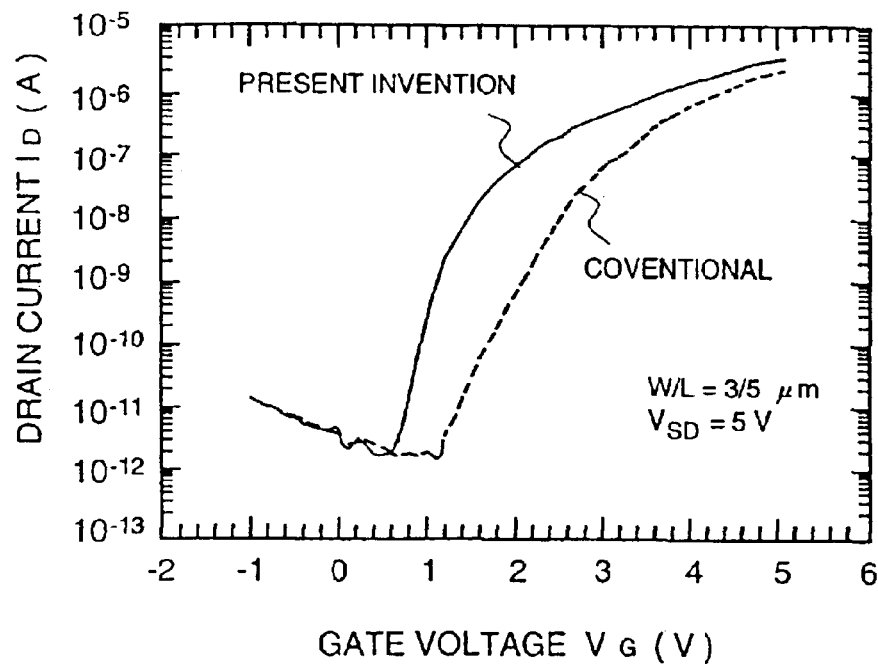
FIGS. 25A and 25B are diagrams indicative of current-voltage characteristics of the semiconductor element of FIGS. 19A–19D.
Figure 25B:
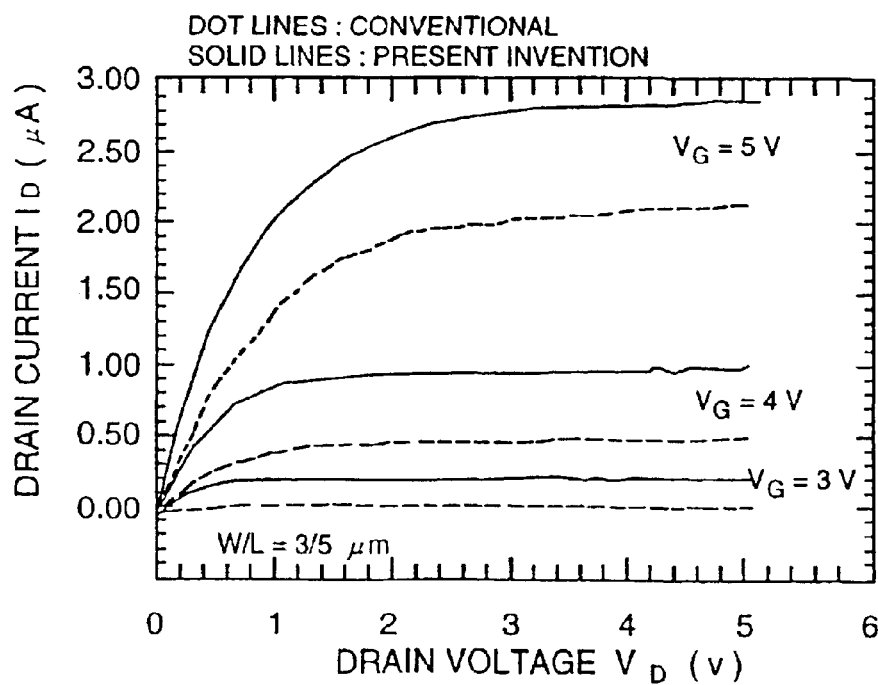

Current-voltage characteristics of the TFTs according to this embodiment of the invention, such as drain current to gate voltage characteristics, as well as drain current to drain voltage characteristics, are compared to those of conventional TFTs in FIGS. 25A and 25B. It is clearly indicated in the drawings that TFTs of the invention have an improved current drive capability which is substantially greater than the conventional TFTs.

Sixth Embodiment

Figure 10:
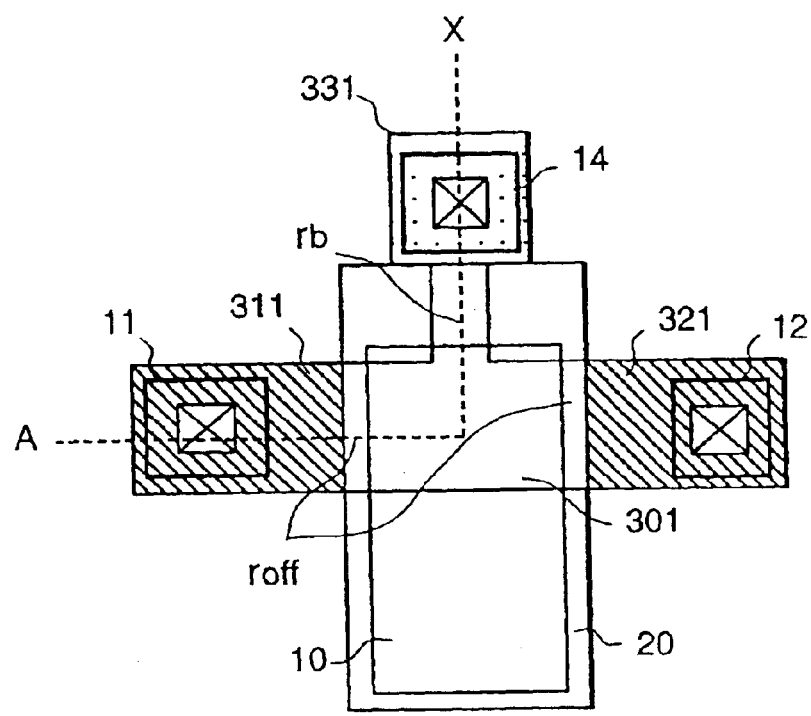
FIG. 10 is a plan view of a semiconductor element according to a sixth embodiment of the invention.
Figure 11:
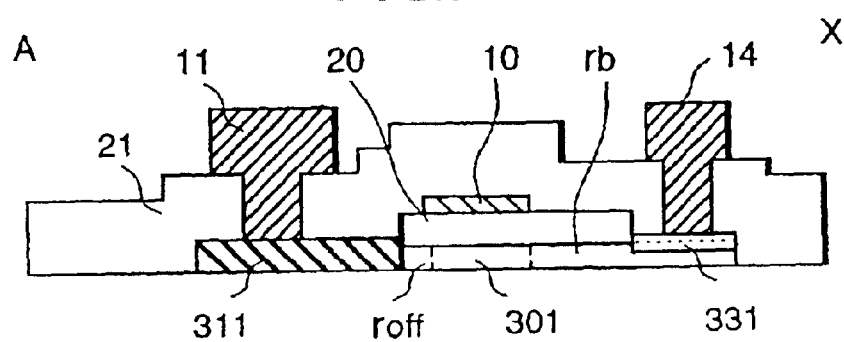
FIG. 11 is a cross-section of a TFT taken along line X-A in FIG. 10.

With reference to FIG. 10, a plan view of a planar type TFT according to a sixth embodiment of the invention is illustrated. FIG. 11 is a cross-sectional view taken along line X-A in FIG. 10.

According to this embodiment of the invention, like the fifth embodiment, an intrinsic semiconductor layer 301 is formed to have a convex planar pattern, with a pattern of a gate electrode 10 disposed in the center thereof. On both sides of the intrinsic semiconductor layer 301 there are formed an n+layer 311 as the source and an n+layer 321 as the drain, respectively. Further, a p+layer 331 is formed as the base in a protruding portion of the convex patterned intrinsic semiconductor layer 301. Further, in a portion below the gate electrode extending from the intrinsic semiconductor layer 301 (channel) to the p+layer 331, there is formed a high electrical resistance layer rb which is not doped with any impurities of P-type or N-type. These features are the same as those in the fifth embodiment of the invention. Another feature of this embodiment is characterized by provision of an off-set layer roff made of the intrinsic semiconductor layer 301 between the n+layer 311 as the source and the n+layer 321 as the drain, and an intrinsic semiconductor layer 301 (channel) directly below the gate electrode 10. That is, the n+layers 311 operating as the source, the layer 321 operating as the drain, and the p+layer 331 operating as the base are arranged so that they are separated by intrinsic semiconductor layer 301 from each other. In order to realize such an arrangement, the pattern of the gate insulating film 20 is arranged to have a larger size than that of the gate electrode 10, and by utilizing the pattern of this gate insulating film 20 as a mask pattern for masking other counterparts, the n+layers 311, 321 operating as the source and drain or the p+layer 331 operating as the base are formed advantageously.

According to this embodiment of the invention, like the case of the first embodiment, the majority carrier is an electron and the minority carrier is a hole. In this arrangement, a positive voltage, which is positive relative to the source electrode 11, is applied to the base electrode 14, which is in contact with the p-type poly-Si layer 331, thereby causing the minority carrier of holes to be injected into the intrinsic poly-Si layer 301. Thereby, according to the same principle of operation as the semiconductor element of FIG. 1, the threshold voltage is successfully decreased, thereby improving the current drive capability substantially. Further, by providing an electrical connection between the base electrode 14 and the gate electrode 10 according to this embodiment of the invention, the operation of the semiconductor element having a three-terminal configuration as indicated in FIG. 7 can be realized. In this configuration, since the off-set layer roff, as well as the high resistance layer rb, acts to limit the base current, an excess base current injection is more effectively prevented, thereby ensuring operation at a low electric power until the gate voltage is increased substantially greater. Further, since the off-set layer acts to mitigate the electrical field present between the source electrode 11 and the drain electrode 12, the occurrence of hot carriers is suppressed, thereby improving the reliability of the components substantially.

Seventh Embodiment

Figure 12:
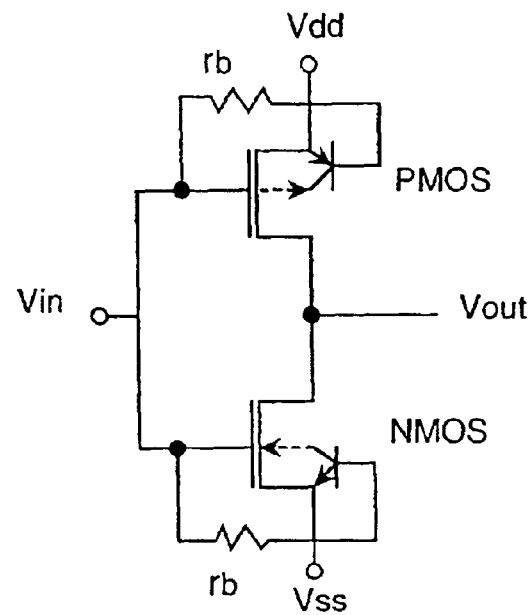
FIG. 12 is a circuit diagram of a complementary type inverter according to a seventh embodiment of the invention.
Figure 13:
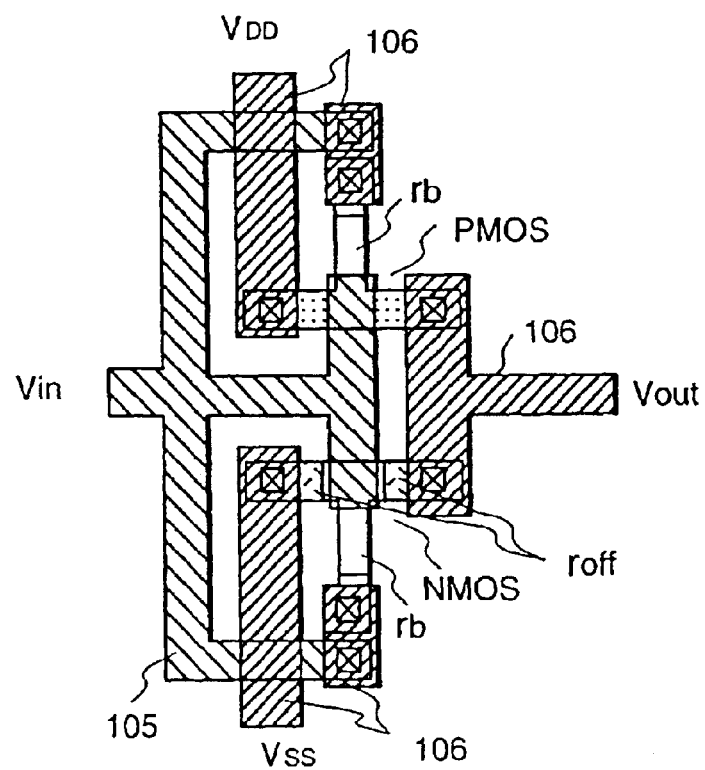
FIG. 13 is a plan view of the complementary type inverter of FIG. 12.

FIG. 12 is a schematic diagram of a circuit configuration of a complementary (CMOS) inverter using the semiconductor elements of FIGS. 8 and 9, and FIG. 13 is a pattern configuration of the inverter circuit of FIG. 12. This type of inverter may be used, in particular, in the drive circuit in a liquid crystal display. The complementary inverter according to this embodiment of the invention is comprised of a P-type transistor PMOS and an N-type transistor NMOS, wherein each gate and base in each transistor are electrically connected via a base resistance rb. A first wiring electrode 105 coupling gate electrode 10 of the TFT with the input terminal Vin is provided extending to a protrusion of a TFT having a convex pattern, and is electrically connected via a second wiring electrode 106 to the base electrode formed in the protrusion.

Further, electrodes for supplying a reference voltage Vss and a power supply voltage Vdd to the circuit, as well as an output terminal Vout, are provided by the second wiring electrode 106. In order to realize a fast circuit operation, the intrinsic poly-Si film 301, which has a greater carrier mobility, is used as an active layer. Further, in order to prevent degradation of the characteristics during operation due to hot carriers, N-type transistors in which hot carriers tend to occur are fabricated to have the off-set layer roff as indicated in FIG. 10.

Transistors constituting the inverter circuit according to this embodiment are enabled to operate at a lower threshold voltage by the action described above. Thereby, operation at a lower supply voltage is enabled, advantageously decreasing power consumption in the circuit. Further, since the high resistance rb is inserted between the input terminal and the base electrode 14 of the TFT, an input current flowing from the input terminal to the source electrode via the base electrode 14 is suppressed, thereby decreasing power consumption.

Eighth Embodiment

Figure 14:
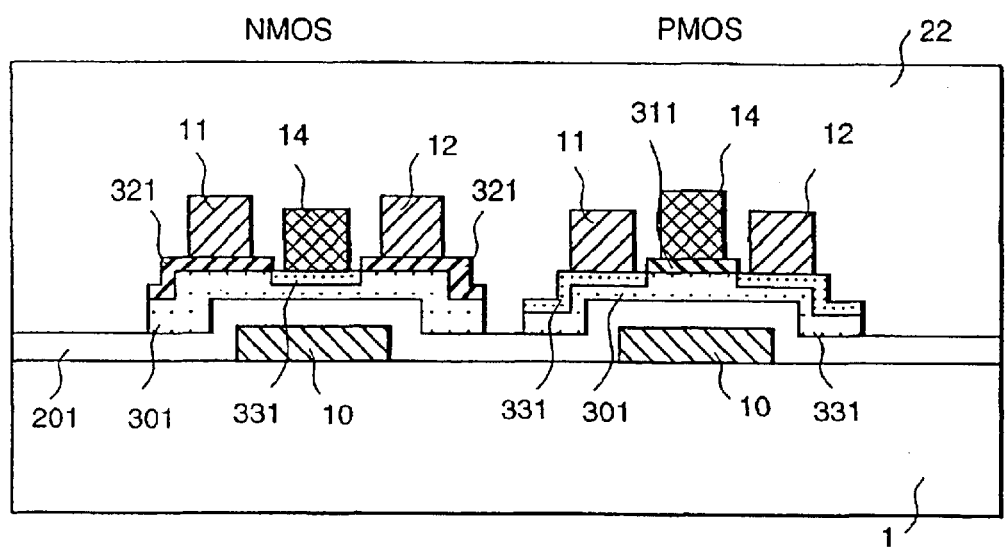
FIG. 14 is a cross-section of a complementary type inverter according to an eighth embodiment of the invention.
Figure 15:
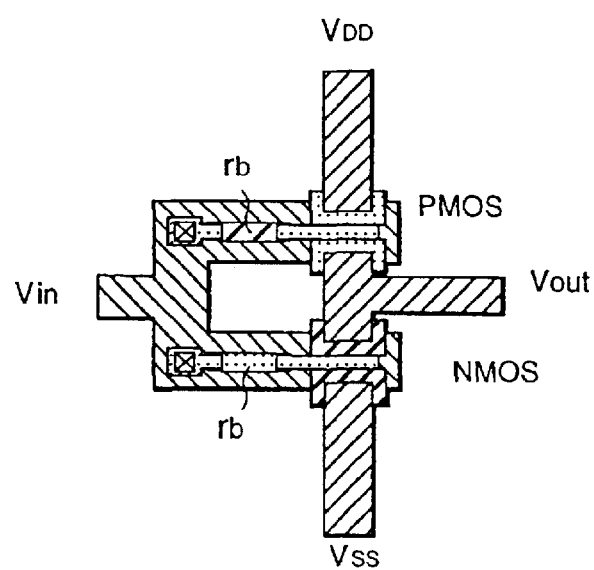
FIG. 15 is a plan view of the complementary type inverter of FIG. 14, which is a planar type semiconductor element of the invention.

FIG. 14 is a cross-sectional view of a complementary (CMOS) inverter circuit comprised of the inverted staggered TFTs indicated in FIG. 1, and FIG. 15 shows the configuration of the inverter circuit of FIG. 14. The structure of an N-type transistor indicated to the left side in FIG. 14 is the same as in FIG. 1. However, in order to realize a faster circuit operation, the intrinsic poly-Si film 301 having a greater carrier mobility is used as its active layer. The structure of a P-type transistor indicated to the right side in FIG. 14 has a complementary structure with respect to that of the above-mentioned N-type transistor. Namely, the n-type poly-Si layers 311, 321 are formed selectively and partially on the surface of the intrinsic poly-Si film 301, and further, the P-type poly-Si layers 331 are formed on the other areas of the surface of the intrinsic poly-Si film 301, where the n-type poly-Si layers 311, 321 are not formed. In the above P-type transistor, the minority carrier, which is electrons, is injected from the base electrode 14 and via the n-type poly Si layer 311, whereby its threshold voltage is decreased by the same action as in the N-type transistor.

Therefore, it becomes possible for the inverter comprised of semiconductor elements according to the invention to be switched at a low input voltage yin, thereby effectively reducing power consumption in the circuit. Further, as in the embodiment of FIG. 13, the bases of the P-type transistor and N-type transistor are connected to their gate electrodes via a base resistance rb. Thereby, since an input current flowing from the input terminal to the source electrode through the base electrode 14 is suppressed, the power consumption can be substantially reduced.

Ninth Embodiment

Figure 16:
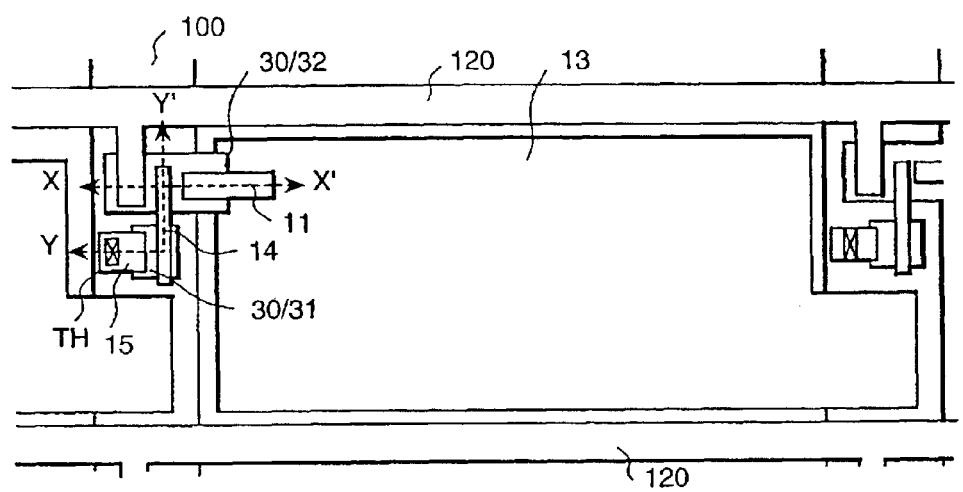
FIG. 16 is a plan view of a unit picture element in a liquid crystal display according to a ninth embodiment of the invention.

FIG. 16 is a plan view of a unit picture element of a TFT active matrix constructed using the semiconductor elements of FIG. 1. A cross-section of the structure taken along line X-X' in FIG. 16 is the same as that of FIG. 1. The unit picture element of the active matrix is comprised of a scanning electrode 100 formed on a glass substrate; a signal electrode 120 formed to intercross with the scanning electrode; a TFT formed in the vicinity of the intersection of these electrodes, including an intrinsic a-Si film 30, a source electrode 11 and a base electrode 14 formed on the intrinsic a-Si film 30; a pattern of an intrinsic a-Si film 30 formed separate from the intrinsic a-Si film 30 of the TFT and an n-type a Si film 31; and a picture element electrode 13 connected to the source electrode 11 of the TFT.

Figure 17:
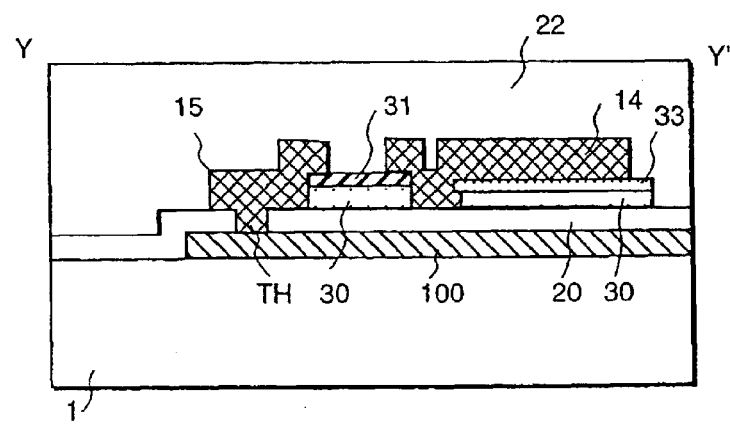
FIG. 17 is a cross-section of the liquid crystal display taken along line Y-Y' in FIG. 16.

As seen from FIGS. 1 and 17, the base electrode 14 is arranged to electrically contact the p-type a-Si layer 33 which is formed on the surface of the intrinsic a-Si film 30 which constitutes the TFT with a pattern of the n-type a-Si film 31, which is formed on the surface of an intrinsic a-Si film 30 formed separate from the p-type a-Si layer 33. A contact electrode 15 is formed separate from the base electrode 14 and in contact at its one end with the e-type a-Si film 31 on the intrinsic a-Si film 30, and at the other end the contact electrode 15 is connected with scanning electrode 100 via a through-hole TH provided in a gate insulating film 20.

In this arrangement, the pattern of the n-type a-Si film 31 formed on the intrinsic a-Si film 30, which is in contact both with the base electrode 14 and the contact electrode 15, provides for a base resistance corresponding to the base resistance rb in the equivalent circuit of FIG. 7. The value of resistance rb can be controlled by adjusting the gap between the base electrode 14 and the contact electrode 15. Scanning electrode 100 can feed a base current since it is connected to base electrode 14 via the resistance, thereby eliminating the necessity of providing additional feeder wiring, and thereby preventing the aperture ratio of picture elements from decreasing. Further, since the base resistance is formed utilizing one of the semiconductor films which constitute the TFT, an additional process for forming the resistance is eliminated, thereby simplifying the process of fabrication.

Figure 18:
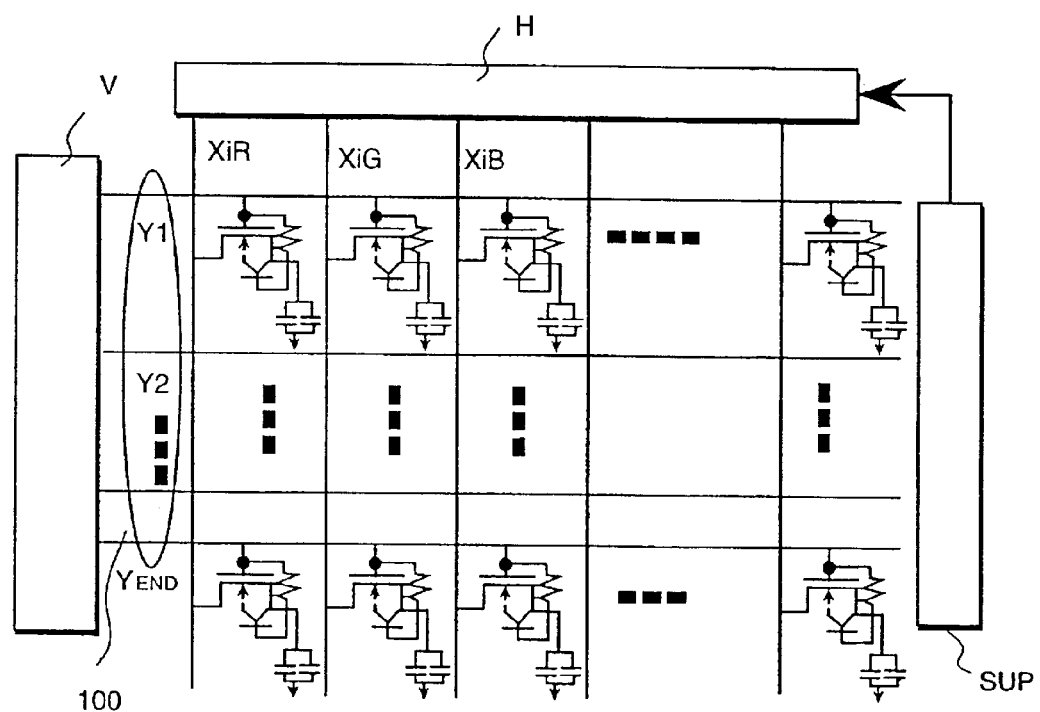
FIG. 18 is an equivalent circuit indicative of a schematic configuration of the liquid crystal display.

FIG. 18 is a schematic diagram representing an equivalent circuit of a display constructed using the unit picture elements of FIG. 16. In the drawing of FIG. 16, XiG, Xi+1G, . . . , represent picture signal electrodes each connected to a picture element for forming a green filter G. Likewise, XiB, Xi+B, . . . , represent picture signal electrodes each connected to a picture element for forming a blue filter, and XiR, Xi+R, . . . , represent picture signal electrodes each connected to a picture element for forming a red filter. Yi, Yi+1, . . . , are scanning electrodes 100 for selecting picture element columns X1, X2, . . . , and these scanning electrodes 100 are connected to a vertical scanning circuit V. The picture signal electrodes are connected to a picture signal drive circuit H. A block SUP includes a power circuit for obtaining a plurality of stabilized power supplies by dividing a single power supply and a converter circuit for converting information suitable for display on a cathode ray tube supplied from a host computer to information suitable for display on a liquid crystal display. Each of a plurality of display regions surrounded by a plurality of scanning electrodes and a plurality of picture signal electrodes on the display area formed on the insulated substrate is comprised of a switching element connected to its associated scanning electrode and picture signal electrode, a picture element electrode connected to the switching element, a counterposed electrode disposed opposite to the picture element electrode, and a liquid crystal layer interposed between the picture element electrode and the counterposed electrode.

As this switching element provided in each display region, the semiconductor element of the invention is used.

By use of the semiconductor element of the invention as the switching element in each display region, an output voltage from vertical scanning circuit V can be decreased, thereby substantially reducing the power consumption in the liquid crystal display.

Tenth Embodiment

Figure 19A:
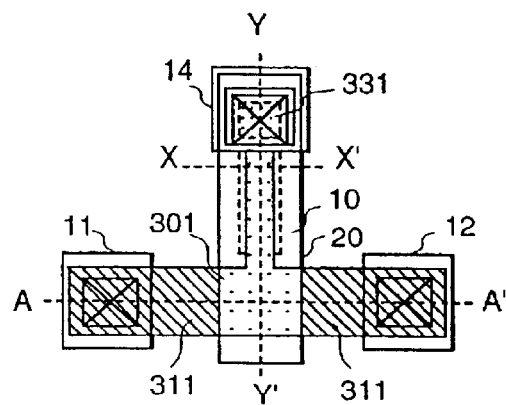
FIGS. 19A and 19B are plan views and FIGS. 19C and 19D are cross-section views of a semiconductor element according to a tenth embodiment of the invention.
Figure 19B:
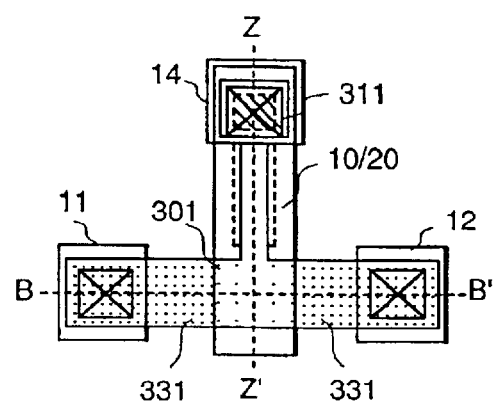
Figure 19C:
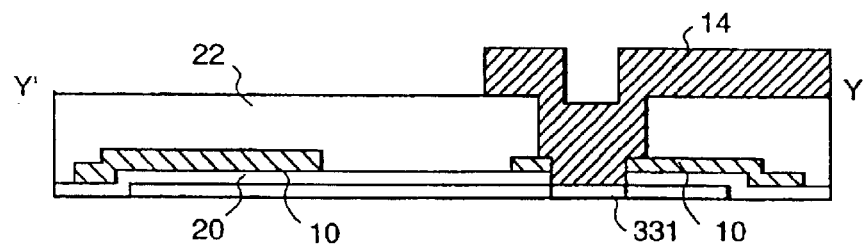
Figure 19D:
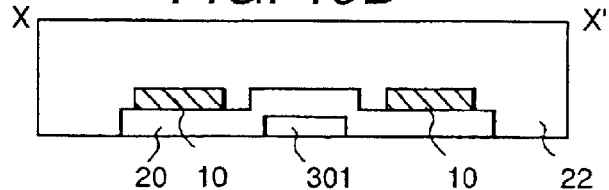

FIG. 19A and FIG. 19B are plan views of a planar type TFTs according to a tenth embodiment of the invention. FIGS. 19A and 19B depict N-type and P-type TFTs, respectively. Further, FIG. 19C is a cross-sectional view taken along line Y-Y' in FIG. 19A, and FIG. 19D is a cross-sectional view taken along line X-X' in FIG. 19A. Other cross-sections along lines A-A', B-B' and Z-Z' of FIGS. 19A and 19B will be shown in FIG. 24, to be described later.

According to this embodiment of the invention, in the same manner as in the fifth embodiment of the invention, an intrinsic semiconductor layer 301 having a convex planar pattern is provided, and a pattern of a gate electrode 10 is disposed in the center thereof, and n+layers 311 and 321 are formed as the source and drain on both sides of the intrinsic semiconductor layer, respectively. Further, a p+layer 331 is formed as the base in the upper protrusion of the convex intrinsic semiconductor layer 301. Further, as in the fifth embodiment of the invention, in a portion extending from the intrinsic semiconductor layer 301 (channel) under the gate electrode to p+layer 331, there is formed a high resistance layer rb which is not doped with any impurities of P-type or N-type. According to this embodiment, an off-set layer roff made of the intrinsic semiconductor layer 301 is formed between the n+layers 311, 321 operating as the source and drain, and the intrinsic semiconductor layer (channel) immediately below the gate electrode 10. Namely, the structures of the n+layers 311, 321 operating as the source and drain and of the p+layer 331 operating as the base are separated by the intrinsic semiconductor layer 301. In order to provide for such structures according to this embodiment, the pattern of the gate insulating film 20 is formed in a larger size than that of the gate electrode 10, and then this pattern of the gate insulating film 20 is utilized as a mask for forming the n+layers 311, 321 operating as the source and drain, or for forming the p+layer 331 operating as the base.

Further, as another feature according to this embodiment of the invention, as depicted in FIGS. 19C and 19D, gate electrode 10 has a structure such that it extends to the upper protruding portion of the convex type intrinsic semiconductor layer 301, and it has a planar pattern having devoid portions above the p+layer 331 provided as the base and above the high resistance layer rb, and further the p+layer 331 as the base and gate electrode 10 extending to the protruding portion are electrically connected by the base electrode 14. By providing a connection between the p+layer 331 and the gate electrode 10, the semiconductor device of this embodiment can be used as a three-terminal semiconductor element. By adoption of this planar circuit pattern in this embodiment of the invention, the gate electrode 10 and the base electrode 14 can be advantageously connected while minimizing an increase in area to be occupied by the semiconductor device. Further, by removing a part of the gate electrode 10 disposed on the high resistance layer rb, changes in the values of the high resistance layer rb due to a gate voltage can be eliminated, thereby providing a stabilized base current limiting function. Still further, since the off-set layer roff in addition to the high resistance layer rb acts to limit the base current, an excess base current injection can be more effectively prevented, thereby ensuring operation at a low power until the gate voltage is increased substantially. Furthermore, since the off-set layer acts to mitigate electrical field present between the source electrode 11 and the drain electrode 12, generation of hot carriers is suppressed, thereby substantially improving the reliability of the semiconductor device.

Figure 20A:
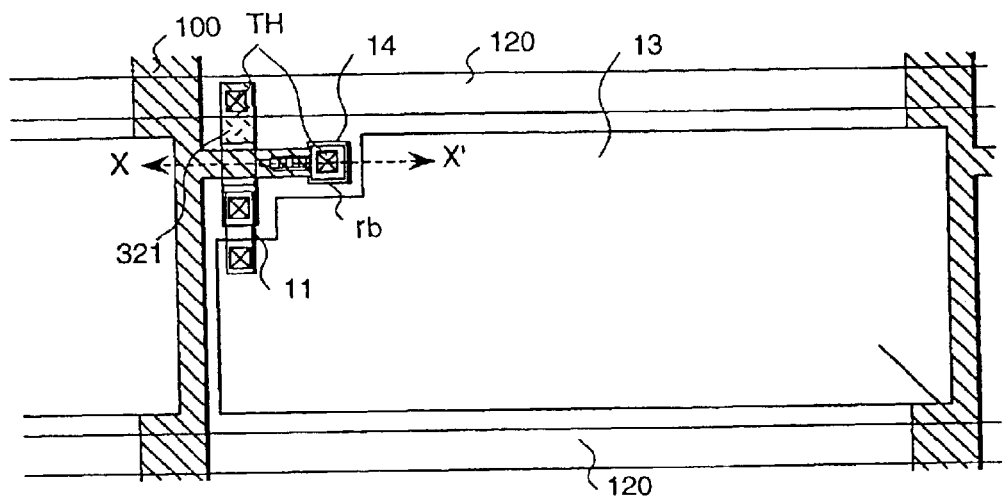
FIG. 20A is a plan view and FIG. 20B is a cross-section of a unit picture element of a liquid crystal display constructed using the semiconductor element of FIGS. 19A–19D.
Figure 20B:
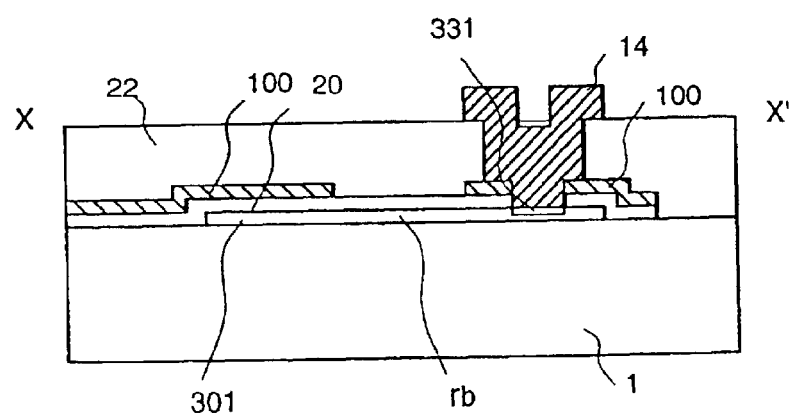

FIG. 20A is a plan view of a unit picture element of a TFT active matrix constructed using the semiconductor device of FIG. 19A, and FIG. 20B is a cross-sectional view taken along line X-X' in FIG. 20A.

This active matrix is comprised of a scanning electrode 100 formed on the surface of a glass substrate; a signal electrode 120 formed so as to intercross with the scanning electrode; a TFT formed in the vicinity of the intersection of these electrodes, including an intrinsic poly-Si film 301, a source electrode 11 and a base electrode 14, each connected to the intrinsic poly-Si film 301 via a through-hole; and a picture element electrode 14 connected to the source electrode 11 of the TFT. As can be seen from FIG. 20B and as indicated in FIG. 19C, base electrode 14 connects the n+layer 331 and the gate electrode 10. By connecting the base electrode 14 and the scanning electrode 100 in this manner according to the invention, the scanning electrode 100 is also adapted to feed a base current, hence eliminating the necessity of providing additional feeder wiring, thereby preventing the aperture ratio of the picture element from being reduced. Still further, since the base resistance can be formed using a part of the semiconductor film which constitutes the TFT, an additional process for forming the resistance is eliminated, thereby simplifying the process of manufacture of the semiconductor device.

Figure 21:
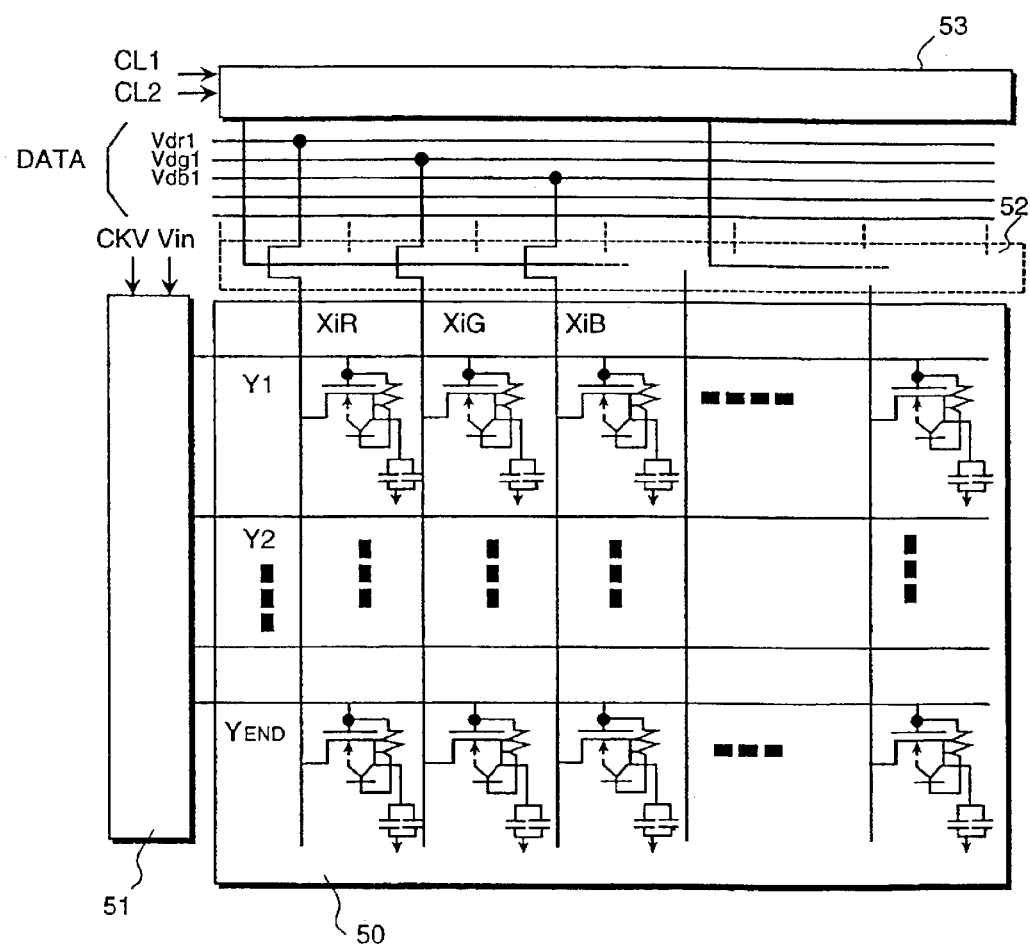
FIG. 21 is an equivalent circuit of a drive circuit built-in type liquid crystal display constructed using the semiconductor element of FIGS. 19A–19D.
Figure 22:
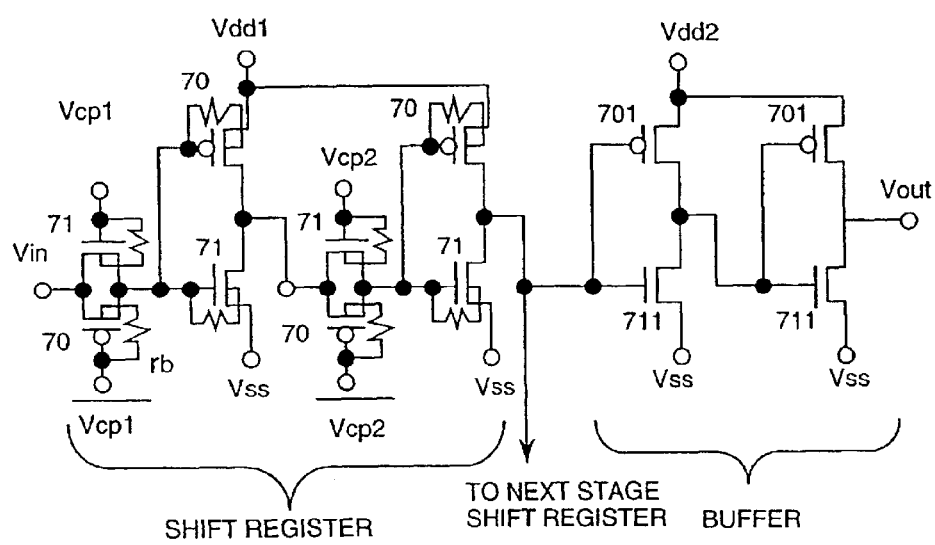
FIG. 22 is a schematic circuit diagram including a shift register and a buffer used in the drive circuit built-in type liquid crystal display of FIG. 21.

FIG. 21 shows an equivalent circuit of a display which is provided by integrating on the same substrate the drive circuits constructed using the CMOS inverter of FIGS. 12 and 13, and the TFT active matrix of FIG. 20A. This display is comprised of a TFT active matrix 50 according to the invention; a vertical scanning circuit 51 for driving the matrix; a horizontal scanning circuit 53 for dividing a video signal per scan into a plurality of blocks and supplying them in a time-sharing manner; data signal lines Vdr1, Vdg1, Vdb1, . . . , for supplying video signal data; and a switch matrix circuit 52 for supplying video signals, divided into a plurality of blocks, to the active matrix. Vertical scanning circuit 51 and horizontal scanning circuit 53 are constructed using a shift register and a buffer (to be described later with reference to FIG. 22), and are driven by clock signals CL1, CL2, and CKV. FIG. 22 depicts a scanning circuit corresponding to one scanning line. In FIG. 22, numeral 70 depicts a P-type transistor and 71 depicts an N-type transistor. Each of these transistors has a structure in which its base and gate are connected via resistance rb. The shift register operates at a timing using two phase clock signals (Vcp1, Vcp2) and inverse clock signals (Vcp1, Vcp2), reverses an input voltage and shifts it then to be transferred to the buffer. At the same time, this signal to be transferred to the buffer is also input as an input voltage to a shift register corresponding to the subsequent scanning line. The buffer outputs a pulse voltage at a maximum voltage of Vdd2, which becomes a scanning voltage for the active matrix display.

It has been confirmed that the shift register of a complementary type TFT using the semiconductor device according to the invention is able to operate at a half of the power consumption normally required with the conventional shift registers using conventional TFTs. Further, since TFTs for constituting the active matrix are constructed using the semiconductor device according to the invention, the output level or Vdd2 of the scanning circuit has been halved compared to the conventional level. Thereby, the total power consumption of the whole active matrix substrate has been reduced to one third of the conventional.

Although the planar type TFT was used in the above-mentioned embodiment of the invention, the invention is not limited thereto, since the inverted staggered type or staggered type TFTs as indicated in FIGS. 1 or 2 may be used as well. It should be noted, however, that since in the planar type semiconductor device the parasitic capacitance between the gate and source or drain can be reduced, a faster operation can be attained.

Eleventh Embodiment

FIGS. 23A to 23D illustrate respective fabrication steps in cross-sectional view of the semiconductor device of the invention depicted in FIG. 1. A Cr film is accumulated by sputtering on the surface of a glass substrate 1 to a thickness of 100 nm and is patterned into a predetermined planar shape using a known photolighography process so as to provide a gate electrode 10. Then, over the entire area of the substrate, including the surface of the gate electrode 10, there are formed a silicon nitride (SiN) film 20, an intrinsic amorphous silicon (a-Si) film 30, and an n-type a-Si film 31, sequentially using the plasma CVD method. The respective film thicknesses are 350 nm for the SiN film, 200 nm for the intrinsic a-Si film and 40 nm for the n-type a-Si film (see FIG. 23A).

Figure 23A:
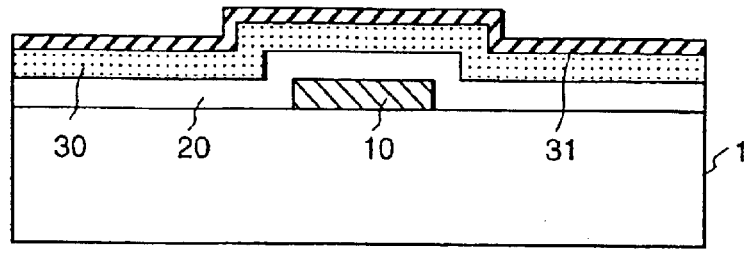
FIGS. 23A to 23D are cross-sectional views of a semiconductor element indicative of steps of a process of fabrication thereof according to an eleventh embodiment of the invention.
Figure 23B:
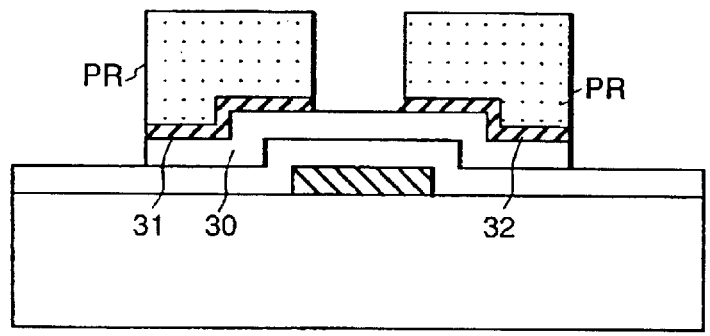

After having patterned the intrinsic a-Si film and n-type a-Si film into predetermined planar shapes, a photo-resist PR having a predetermined planar shape is formed on an n-type a-Si film 31 such that by using the photo-resist as its mask, the n-type a-Si film 31 is patterned into a predetermined shape by plasma etching, that is, the n-type a-Si film 31 is separated into two parts including the n-type a-Si film 31 and the n-type a-Si film 32 (see FIG. 23B).

Figure 23C:
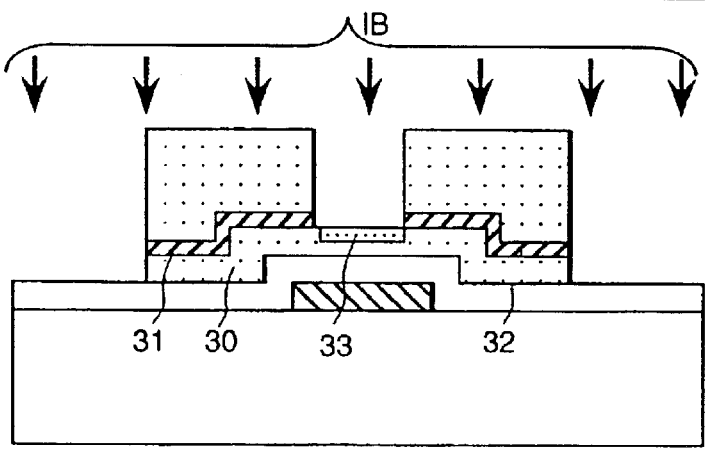
Figure 23D:
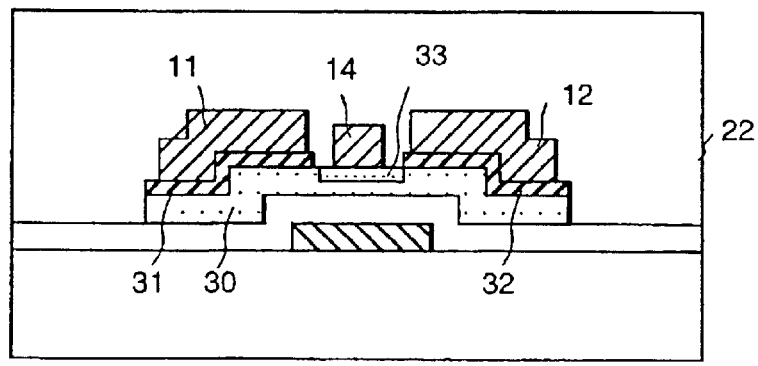

Subsequently, an ion beam IB which contains boron is irradiated over the entire area on the substrate with the photo-resist still remaining, thereby forming a p-type a-Si film 33 in an area on the surface of the intrinsic a-Si film 30 from which the n-type a-Si film 31 was removed partially (refer to FIG. 23C).

Then, after having removed the photo-resist PR, Cr and Al are sputtered to a thickness of 40 nm and 400 nm, respectively, and are each patterned into a predetermined shape so as to provide for a source electrode 11, drain electrode 12 and base electrode 14, respectively. Finally, a SiN film is formed by the plasma CVD method to a thickness of 400 nm as a passivation film 22, thus completing the fabrication of the semiconductor element of the invention (refer to FIG. 23D).

According to this embodiment of the invention, p-type a-Si layer 33 is formed by self-alignment with respect to the patterns of the n-type a-Si layers 31 and 32. That is, the p-type a-Si layer 33 is formed utilizing the patterns of the n-type a-Si layers 31, 31 as its own mask. Thereby, both the n-type a-Si layers 31, 32 and the p-type a-Si layer 33 can be formed advantageously by one photolithographic process according to the invention, thereby simplifying the process of fabrication and reducing the cost of manufacture.

Twelfth Embodiment

With reference to FIGS. 24A to 24F, fabrication steps in the process of fabricating the complementary (CMOS) semiconductor device indicated in FIGS. 19A to 19D according to the invention are illustrated in respective cross-sectional views. In FIGS. 24A to 24F, sections indicated by A-A', Y-Y', B-B', Z-Z' correspond respectively to cross-sections indicated by A-A7, Y-Y', B-B', Z-Z' in FIGS. 19A to 19D.

Figure 24A:
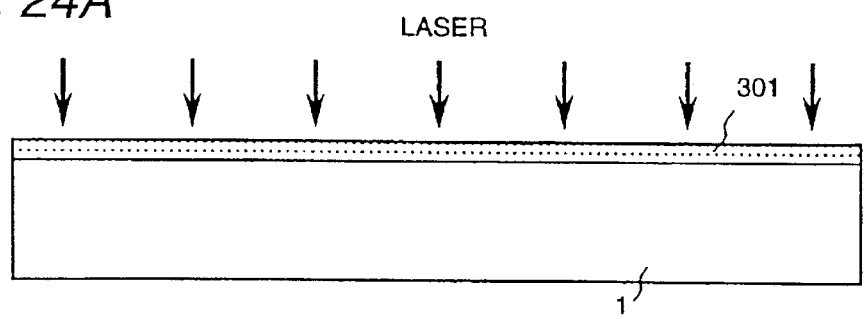
FIGS. 24A to 24F are cross-sectional views of a semiconductor element indicative of steps of a process of fabrication thereof according to a twelfth embodiment of the invention.

After forming an intrinsic a-Si film 30 on a glass substrate to a thickness of 50 nm by the LPCVD method, a high intensity XeCl excimer laser beam LASER is irradiated at an energy density of 330 mJ/cm$^2$ from the above such that the intrinsic a-Si film 30 is caused to melt and recrystallize to obtain an intrinsic polycrystalline silicon (poly-SI) film 301 (refer to FIG. 24A).

Figure 24B:
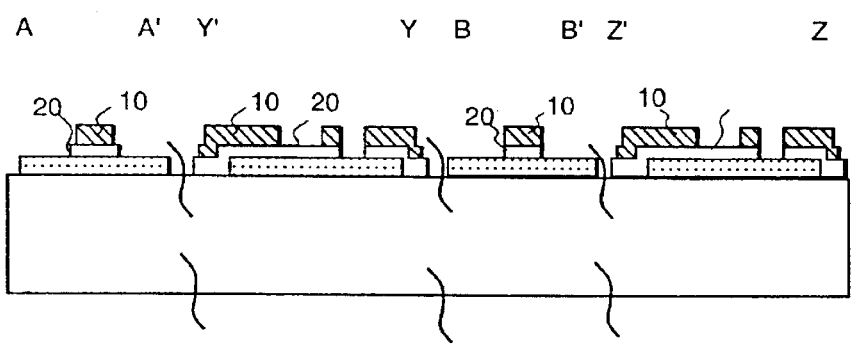

After patterning the poly-Si film 301 into a predetermined planar pattern, a SiO$_2$ film is formed to a thickness of 100 nm by the plasma CVD method, and an Al film is formed to a thickness of 100 nm by the sputtering method, and they are patterned into respective planar patterns so as to provide a gate insulating film 20 and a gate electrode 10 (refer to FIG. 24B).

Figure 24C:
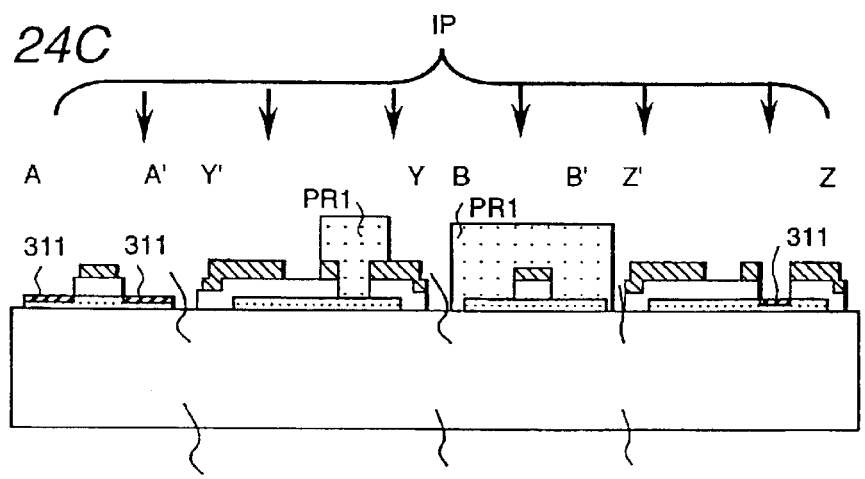
Figure 24D:
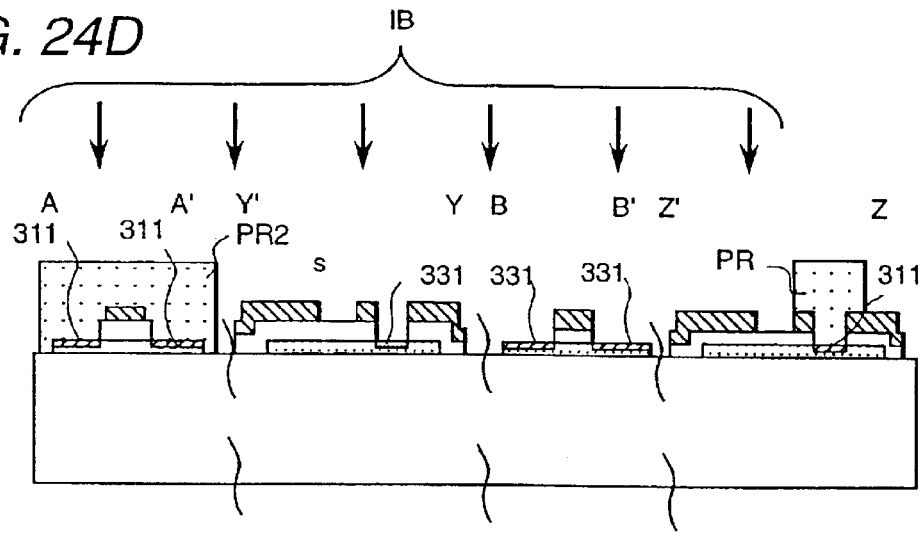

After forming a photo-resist pattern PR1 having a predetermined shape, and by using patterns of the photoresist PR1 and gate electrode 10 as its mask, an ion beam IP which contains phosphor is irradiated to form an n-type poly-Si layer 311 (refer to FIG. 24C).

After having removed the photo-resist pattern PR1, another photo-resist pattern PR2 is formed, and by using patterns of the photo-resist PR2 and gate electrode 10 as its mask, an ion beam which contains boron is irradiated thereover, thereby forming p-type poly-Si layers 331. After having removed the photo-resist pattern PR2, an XeCl excimer laser beam is irradiated once again thereover at an energy density of 200 mJ/cm$^2$ so as to activate injected phosphor and boron, thereby decreasing the electrical resistance of the n-type poly-Si layer 311 and p-type poly-Si layer 321 (refer to FIG. 24D).

Figure 24E:
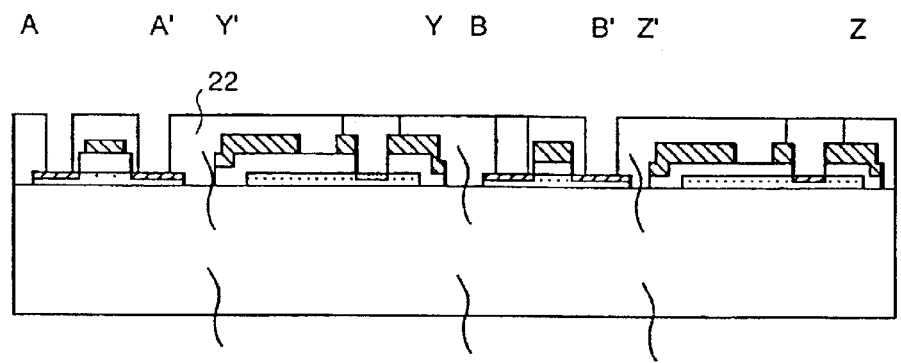

Then, an SiO2 film is formed by the plasma CVD method to a thickness of 300 nm as a passivation film 22, which is then patterned into a predetermined pattern, as depicted in FIG. 24E.

Figure 24F:
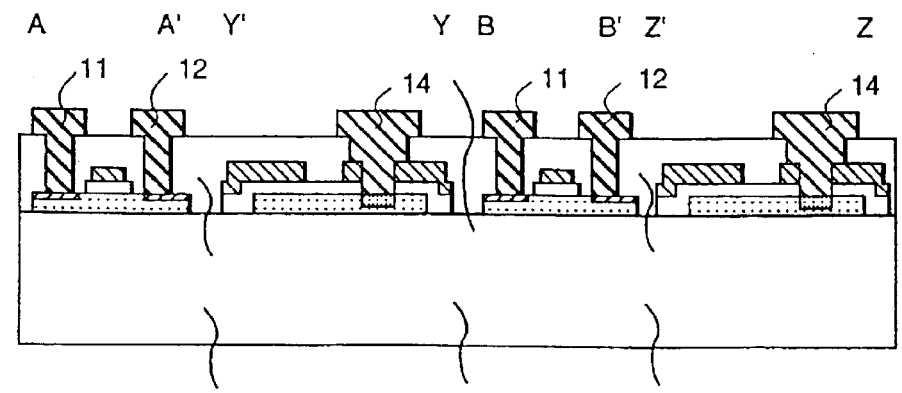

Finally, Cr and Al are deposited to a thicknesses of 40 nm and 400 nm, respectively, by sputtering, and then they are patterned into respective patterns to provide for a source electrode 11, drain electrode 12 and base electrode 14, thereby completing the process of fabrication of the semiconductor element of the invention, as indicated in FIG. 24F.

Thirteenth Embodiment

Figure 26:
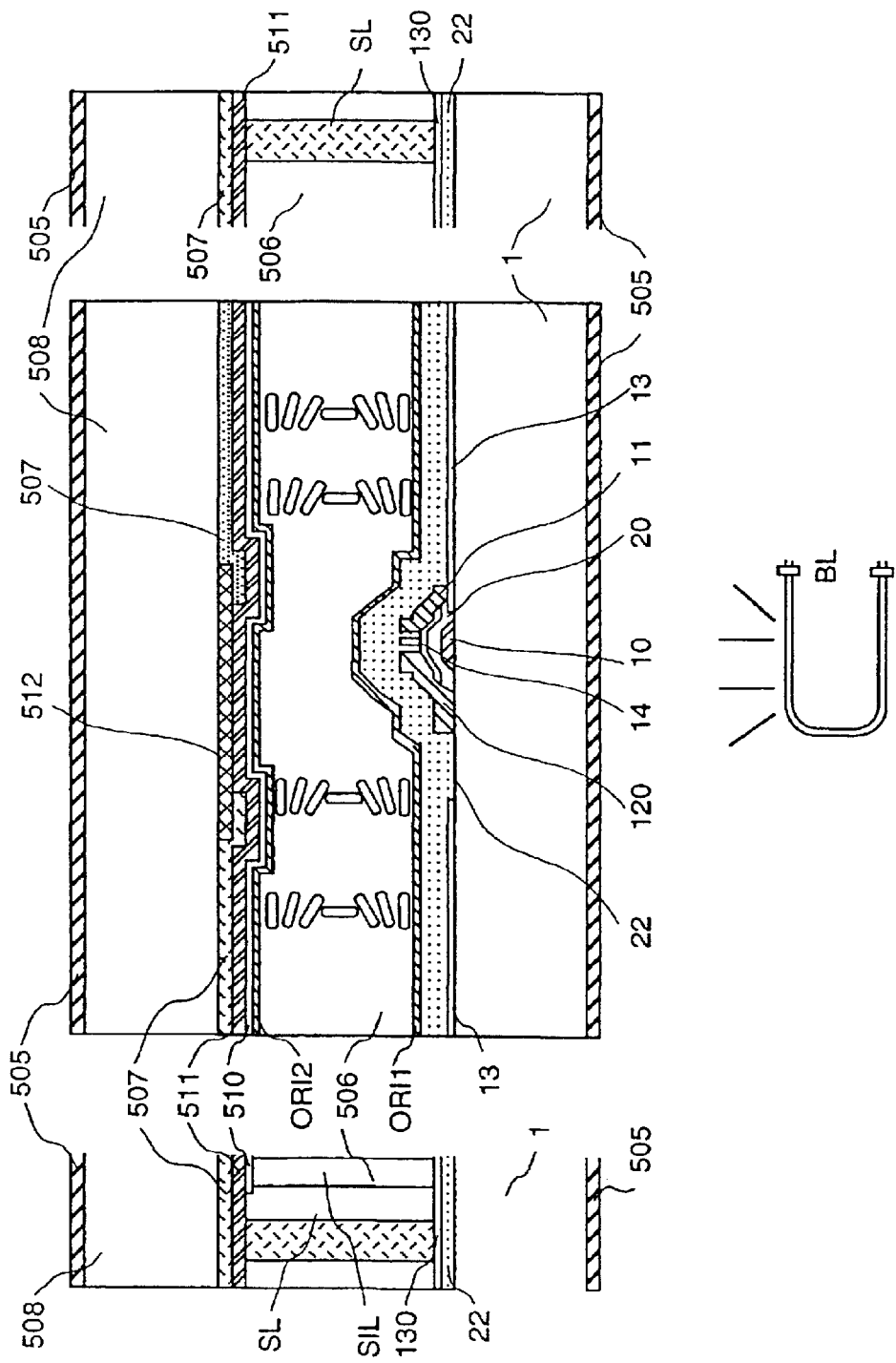
FIG. 26 is a cross-section of a liquid crystal cell of a liquid crystal display according to a thirteenth embodiment of the invention.

FIG. 26 is a diagram in cross-section of a liquid crystal display according to the invention. On a glass substrate 1 disposed below a liquid crystal layer 506 disposed in the center portion in FIG. 26, there are formed a scanning signal electrode 10 and a picture signal electrode 120 both intercrossing in the form of a matrix, a TFT which is formed in the vicinity of the intercrossing, and a picture element electrode 13 made of ITO which is driven via the TFT. On a counterposed glass substrate 508 disposed opposite to the glass substrate 1 with respect to the liquid crystal layer 506, which is interposed therebetween, there are formed a counterposed electrode 510 made of ITO, a color filter 507, a color filter protection film 511 and a shading film 512 which forms a shading black matrix pattern. The center portion of FIG. 26 represents a cross-section of one picture element portion, the left side portion of the drawing represents the left side end portion in cross-section of a pair of glass substrates 1 and 508 wherein an external lead terminal is provided, and the right side portion of the drawing represents the right side end portion in cross-section of the pair of glass substrates 1 and 508 wherein no external lead terminal is provided.

Seal material SL, provided on both sides of the left end portion and the right end portion, is formed so as to seal the liquid crystal layer 506, and is formed along the whole portion of the periphery of the pair of glass substrates 1 and 508 except for a liquid crystal injection port (not shown). The seal material may be made of epoxy resin, for example. Counterposed electrode 510 provided on the counterposed glass substrate 508 is connected at least at a part thereof to the external lead wiring on the glass substrate 1 via silver paste SIL. This external connection wiring is formed in the same fabrication process as employed for the scanning signal wiring 10, source electrode 11, picture signal wiring 120 and base electrode 14. Respective layers of orientation film ORI1, ORI2, picture element electrode 13, protection film 22, and gate SiN film 20 are formed inside the seal material SL. Polarization plate 505 is formed on each outer surface of the pair of glass substrates 1 and 508.

A liquid crystal layer 506 is interposed between the upper orientation film ORI1 and the bottom orientation film ORI2 which set the orientation of the liquid crystal molecules, and the liquid crystal is sealed by the seal material SL. The bottom orientation film ORI1 is formed in the upper portion of protection film 20 on the glass substrate 1. On the internal surface of the counterposed glass substrate 508, there are formed sequentially by lamination shading film 512, color filter 507, color filter protection film 511, counterposed electrode 510 and the upper orientation film ORI2. This liquid crystal display is constructed by the steps of separately forming the layers on the glass substrate 1 and the layers on the counterposed glass substrate 508; laminating the glass substrate 1 and the counterposed glass substrate 508; and sealing the liquid crystal 506 in a space therebetween. Then, a TFT driven color liquid crystal display is provided by effecting adjustment of the transparency of light from a backlight BL using picture element electrode 13.

Since the semiconductor device according to the invention described above is used as a TFT to drive the picture element electrode 13 at a reduced voltage, liquid crystal displays capable of operating at a reduced power consumption have been realized.

Fourteenth Embodiment

Figure 27:
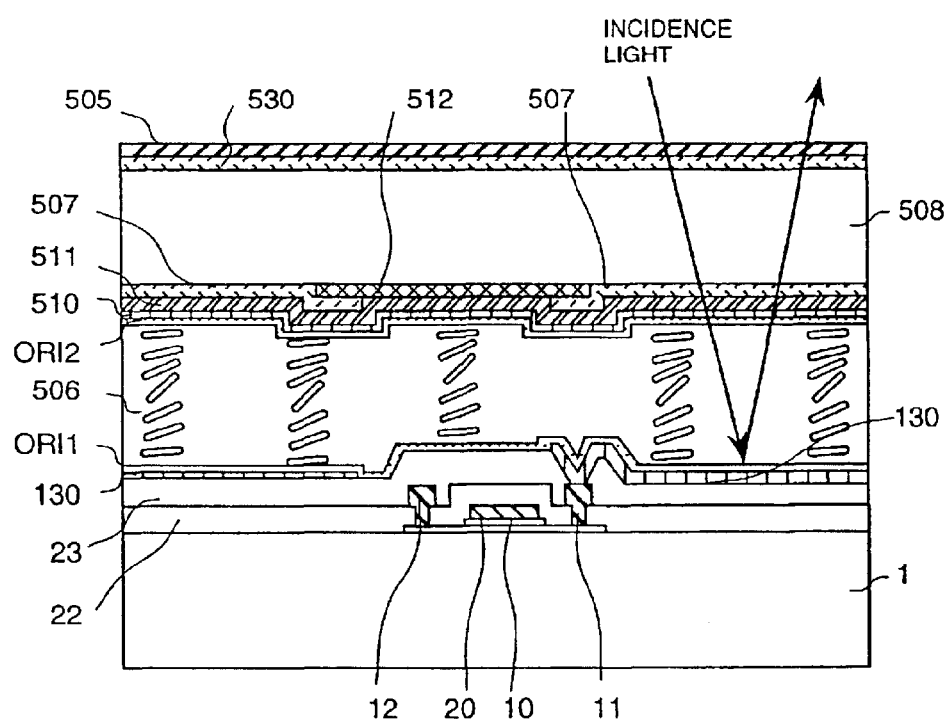
FIG. 27 is a cross-section of a liquid crystal cell of a liquid crystal display according to a fourteenth embodiment of the invention.

FIG. 27 is a diagram in cross-section of a reflection type liquid crystal display according to the invention. Only a cross-section of a picture element portion is indicated. On a glass substrate 1 provided below a liquid crystal layer 506, which is in the center portion in FIG. 27, there are formed a scanning signal electrode 10 and a picture signal electrode 120 intersecting each other in the form of a matrix, and a TFT is formed in the vicinity of the intersection for driving a picture element electrode 130 provided thereon. According to this embodiment of the invention, the picture element electrode 130 is made of Al. On the internal surface of counterposed glass substrate 508 disposed opposite to the glass substrate 1 via the liquid crystal layer 506, there are formed counterposed electrode 510, color filter 507, color filter protection film 511, and a shading film 512, which forms a shading black matrix pattern. Further, a phase plate 530 for shifting the phase of the light and a polarization plate 505 are formed on the outer surface of counterposed glass substrates 1, 508. Respective layers of orientation films ORI1 and ORI2, a picture element electrode 13, a protection film 22, and a gate SiN film 20 are formed inside a seal material (not shown). The liquid crystal layer 506 is inserted between the upper and the bottom orientation films ORI1 and ORI2, which set the orientation of the liquid crystal molecules, and the liquid crystal is sealed by the seal material. The bottom orientation film ORI1 is formed in the upper portion of the protection film 22 on the glass substrate 1. On the internal surface of counterposed glass substrate 508, there are formed in lamination sequentially a shading film 512, a color filter 507, a color filter protection film 511, a counterposed electrode 510 and the upper orientation film ORI2. This liquid crystal display of the invention is fabricated by the steps of separately forming layers on the glass substrate 1 and on the counterposed substrate 508; then, laminating both the glass substrate 1 and the counterposed substrate 508; and sealing the liquid crystal 506 in a space therebetween.

Since this embodiment of the invention is of a reflection type display, incident light comes from a light source Provided outside the counterposed glass substrate 508, and this incident light is reflected from a mirror-finished surface of the picture element electrode 130. A TFT driven reflection type color liquid crystal display according to the invention is thus provided in which the intensity of the reflected light is adjusted in the portion of liquid crystal layer 506. In this type of reflection type display, since the backlight which consumes considerable electric power is eliminated, a low power consuming liquid crystal display can be realized. Further, if the above-mentioned semiconductor device of the invention is utilized as TFTs for driving the picture element electrode 130 and/or TFTs for constituting associated peripheral drive circuits, since the electric power consumed in the active matrix substrate components can be reduced, there can be realized a very low power consuming liquid crystal display. This type of liquid crystal display of the invention is most preferable for use as an image display device in a portable information terminal which is driven by dry cells.

As described heretofore, there is an advantage according to the invention in that the field effect semiconductor device of the invention can reduce its threshold voltage substantially, thereby decreasing the operating voltage of its circuit or active matrix, and thereby reducing the power consumption in the display.

What is claimed is:

1. A liquid crystal display apparatus, comprising:
a pair of substrates at least one of which is transparent;
a liquid crystal layer interposed between said pair of substrates; and
wherein a first of said pair of substrates contains a display region, said display region including (i) a plurality of scanning signal electrodes and a plurality of picture signal electrodes inter-crossing with said plurality of scanning signal electrodes in the form of a matrix, (ii) a plurality of semiconductor elements formed at crosspoints of said matrix, corresponding to intersections between said plurality of scanning signal electrodes and said plurality of picture signal electrodes, and (iii) a plurality of picture element electrodes connected to said semiconductor elements, respectively, and
wherein each of said semiconductor elements comprises a pair of first conductivity type semiconductor regions spaced apart from each other, a second conductivity type semiconductor region spaced apart from said pair of the first conductivity type semiconductor regions and disposed therebetween, a channel region between said pair of first conductivity semiconductor regions and contacting said pair of the first conductivity type semiconductor regions and said second conductivity type semiconductor region, respectively, an insulation layer on said channel region, and a first electrode on said insulation layer, second and third electrodes contacting said pair of first conductivity type semiconductor regions, respectively, and a fourth electrode on which said second conductivity type semiconductor region is provided, each said first electrode is connected to one of said scanning signal electrodes, each second electrode is connected to one of said picture signal electrodes, and each said third electrode is connected to a corresponding picture element electrode.

2. A liquid crystal display apparatus according to claim 1, wherein said channel region is made of a polycrystalline semiconductor film.

3. A liquid crystal display apparatus according to claim 2, wherein said plurality of picture element electrodes are made of aluminum, respectively.

4. A liquid crystal display apparatus according to claim 1, wherein said plurality of picture element electrodes are made of aluminum, respectively.

5. A liquid crystal display apparatus according to claim 1, wherein said channel region includes an intrinsic semiconductor layer.

6. A liquid crystal display apparatus according to claim 5, wherein said plurality of picture element electrodes are made of aluminum, respectively.

7. A liquid crystal display apparatus according to claim 1, wherein said channel region is made of silicon germanium (SiGe) material.

8. A liquid crystal display apparatus according to claim 7, wherein said plurality of picture element electrodes are made of aluminum, respectively.

9. A liquid crystal display apparatus according to claim 1, wherein said fourth electrode is on a principal surface of said first substrate.

10. A liquid crystal display apparatus according to claim 9, wherein said first substrate is transparent.

11. A liquid crystal display apparatus, comprising:
a pair of substrates at least one of which is transparent;
a liquid crystal layer interposed between seed pair of substrates; and wherein a first of said pair of substrates contains a display region, said display region including (i) a plurality of scanning signal electrodes and a plurality of picture signal electrodes inter-crossing with said plurality of scanning signal electrodes in the form of a matrix, (ii) a plurality of semiconductor elements formed at cross-points of said matrix, corresponding to intersections between said plurality of scanning signal electrodes and said plurality of picture signal electrodes, and (iii) a plurality of picture element electrodes connected to said semiconductor elements, respectively, and wherein each of said semiconductor elements comprises a first electrode, an insulation layer on said first electrode, a channel region on said insulation layer, a pair of spaced apart first conductivity type semiconductor layers on said channel region, respectively, a second conductivity type semiconductor layer on said channel region inbetween said pair of first conductivity type semiconductor layers, second and third electrodes respectively on said pair of first conductivity type semiconductor layers, and a fourth electrode on said second conductivity type semiconductor layer, each said first electrode is connected to one of said scanning signal electrodes, each said second electrode is connected to one of said picture signal electrodes, and each said third electrode is connected to a corresponding picture element electrode.

12. A liquid crystal display apparatus according to claim 11, wherein said channel region is made of a polycrystalline semiconductor film.

13. A liquid crystal display apparatus according to claim 12, wherein said plurality of picture element electrodes are made of aluminum, respectively.

14. A liquid crystal display apparatus according to claim 11, wherein said plurality of picture element electrodes are made of aluminum, respectively.

15. A liquid crystal display apparatus according to claim 11, wherein said channel region includes an intrinsic semiconductor layer.

16. A liquid crystal display apparatus according to claim 15, wherein said plurality of picture element electrodes are made of aluminum, respectively.

17. A liquid crystal display apparatus according to claim 11, wherein said first electrode is on a principal surface of said first substrate.

18. A liquid crystal display apparatus according to claim 17, wherein said first substrate is transparent.

19. A liquid crystal display apparatus, comprising:

a pair of substrates at least one of which is transparent;

a liquid crystal layer interposed between said pair of substrates; and wherein one of said pair of substrates contains a display region, said display region including (i) a plurality of scanning signal electrodes and a plurality of picture signal electrodes inter-crossing with said plurality of scanning signal electrodes in the form of a matrix, (ii) a plurality of semiconductor elements formed at cross-points of said matrix, corresponding to intersections between said plurality of scanning signal electrodes and said plurality of picture signal electrodes, and (iii) a plurality of picture element electrodes connected to said semiconductor elements, respectively, and wherein each of said semiconductor elements comprises a pair of first conductivity type semiconductor regions spaced apart from each other, a second conductivity type semiconductor region spaced apart from said pair of first conductivity type semiconductor regions and disposed therebetween, a channel region between said pair of first conductivity semiconductor regions and contacting said pair of first conductivity type semiconductor regions and said second conductivity type semiconductor region, an insulation layer on said channel region, and a first electrode on said insulation layer, second and third electrodes contacting said pair of the first conductivity type semiconductor regions, respectively, and a fourth electrode contacting said second conductivity type semiconductor region, each said first electrode is electrically connected to one of said scanning signal electrodes, each second electrode is electrically connected to one of said picture signal electrodes, and each said third electrode is electrically connected to a corresponding picture element electrode.

20. A liquid crystal display apparatus according to claim 19, wherein said channel region includes one taken from the group consisting of an intrinsic semiconductor layer, a germanium-silicon layer and a polycrystalline silicon layer.

21. A liquid crystal display apparatus according to claim 20, wherein said plurality of picture element electrodes are made of aluminum, respectively.

22. A liquid crystal display apparatus according to claim 19, wherein said plurality of picture element electrodes are made of aluminum, respectively.

* * * * *